(12) United States Patent
Oose

(10) Patent No.: US 10,658,253 B2
(45) Date of Patent: May 19, 2020

(54) SEMICONDUCTOR DEVICE INCLUDING A WARPED PRINTED CIRCUIT BOARD DISPOSED IN A CASE AND METHOD OF MANUFACTURING SAME

(71) Applicant: FUJI ELECTRIC CO., LTD., Kawasaki-shi, Kanagawa (JP)

(72) Inventor: Tomofumi Oose, Matsumoto (JP)

(73) Assignee: FUJI ELECTRIC CO., LTD., Kawasaki-Shi, Kanagawa (JP)

( * ) Notice: Subject to any disclaimer, the term of this patent is extended or adjusted under 35 U.S.C. 154(b) by 0 days.

(21) Appl. No.: 15/908,402

(22) Filed: Feb. 28, 2018

(65) Prior Publication Data

US 2018/0308775 A1  Oct. 25, 2018

(30) Foreign Application Priority Data

Apr. 19, 2017  (JP) ................. 2017-082469

(51) Int. Cl.
*H01L 23/02* (2006.01)
*H01L 23/498* (2006.01)
(Continued)

(52) U.S. Cl.
CPC ............ *H01L 23/02* (2013.01); *H01L 23/053* (2013.01); *H01L 23/24* (2013.01);
(Continued)

(58) Field of Classification Search
CPC ....... H01L 23/02; H01L 23/053; H01L 23/24; H01L 23/5387; H01L 23/5385; H01L 23/49811; H01L 23/535; H01L 25/072; H01L 2224/45124; H01L 2924/171–17798; H01L 23/043; H01L 23/049; H01L 21/67288; G02F 1/133308; G02F 1/136277; H05K 2201/09018;
(Continued)

(56) References Cited

U.S. PATENT DOCUMENTS

2003/0189259 A1* 10/2003 Kurita ..................... H01L 24/27
257/777
2014/0346676 A1* 11/2014 Horio ...................... H01L 25/18
257/773
2016/0056091 A1*  2/2016 Kim ....................... H01L 23/552
257/368

FOREIGN PATENT DOCUMENTS

JP         2000-077602 A      3/2000
JP         2009-289831 A     12/2009
(Continued)

*Primary Examiner* — Nelson Garces
(74) *Attorney, Agent, or Firm* — Rabin & Berdo, P.C.

(57) ABSTRACT

In a semiconductor device, when a printed circuit board is pressed against a bottom part of a case with an adhesive interposed therebetween, the back surface of the printed circuit board is supported by projections formed on the bottom part. Since the gap between the printed circuit board and the bottom part is maintained to have substantially the same height as the projections, the adhesive pressed by the printed circuit board does not spread excessively. At each edge of the printed circuit board in the long-side direction, the end of the adhesive is aligned with or extends slightly beyond the edge. In the short-side direction, the adhesive extends beyond each edge of the printed circuit board, but does not extend over the front surface of the printed circuit board, internal connection terminals, or the front surface of a ceramic circuit board.

18 Claims, 17 Drawing Sheets

(51) Int. Cl.
   *H01L 23/535*   (2006.01)
   *H01L 23/538*   (2006.01)
   *H01L 23/053*   (2006.01)
   *H01L 23/24*    (2006.01)
   *H01L 25/07*    (2006.01)

(52) U.S. Cl.
   CPC ...... *H01L 23/49811* (2013.01); *H01L 23/535* (2013.01); *H01L 23/5385* (2013.01); *H01L 23/5387* (2013.01); *H01L 25/072* (2013.01)

(58) Field of Classification Search
   CPC .......... H05K 2201/09127; H05K 2201/09136; H05K 2201/09045; H05K 3/34
   See application file for complete search history.

(56) References Cited

FOREIGN PATENT DOCUMENTS

JP   2009289831 A   *  12/2009
JP   2015008217 A   *  1/2015

* cited by examiner

SEMICONDUCTOR DEVICE INCLUDING A WARPED PRINTED CIRCUIT BOARD DISPOSED IN A CASE AND METHOD OF MANUFACTURING SAME

CROSS-REFERENCE TO RELATED APPLICATION

This application is based upon and claims the benefit of priority of the prior Japanese Patent Application No. 2017-082469, filed on Apr. 19, 2017, the entire contents of which are incorporated herein by reference.

BACKGROUND OF THE INVENTION

1. Field of the Invention

The embodiments discussed herein relate to a semiconductor device and a method of manufacturing the same.

2. Background of the Related Art

A Semiconductor device called an intelligent power module (IPM) includes a semiconductor element such as an insulated gate bipolar transistor (IGBT), a power metal oxide semiconductor field effect transistor (MOSFET), and the like, and also includes a drive integrated circuit (IC) that provides functions for driving and protecting the semiconductor element. See, for example, Japanese Laid-open Patent Publications No. 2009-289831 and No. 2000-77602. This type of semiconductor device is used in a wide range of field such as a motor drive unit, a power-supply unit, and the like.

In the following, an example of a conventional IPM semiconductor device will be described with reference to FIGS. 11, 12A, and 12B.

FIG. 11 is a plan view illustrating a conventional semiconductor device. FIGS. 12A and 12B are cross-sectional views illustrating mounting of a printed circuit board in the conventional semiconductor device. Note that the cross section illustrated in FIG. 12A is taken along the one-dot chain line X-X of FIG. 11, and the cross section illustrated in FIG. 12B is taken along the one-dot chain line Y-Y of FIG. 11.

A semiconductor device 100 includes a case 11, a printed circuit board 13 accommodated in the case 11, a ceramic circuit board 15, and an adhesive 18 for bonding the printed circuit board 13 to the case 11.

The case 11 includes a frame 11a surrounding the printed circuit board 13 and the ceramic circuit board 15, a terminal block 11b disposed on the inner side of the frame 11a, a bottom part 11c on which the printed circuit board 13 is disposed, and an opening 11d in which the ceramic circuit board 15 is disposed.

The case 11 further includes external connection terminals 12a1 to 12g1 formed on the frame 11a, and internal connection terminals 12a2 to 12g2 connected to the external connection terminals 12a1 to 12g1 in the frame 11a and disposed on the terminal block 11b.

Further, a metal base plate 17 is bonded from the back side of the opening 11d of the case 11, and the ceramic circuit board 15 is bonded by soldering (not illustrated) onto the metal base plate 17 in the opening 11d.

The printed circuit board 13 includes an insulating plate made of a resin, and a conductive pattern (not illustrated) formed on the front surface of the insulating plate. Further, electronic components (not illustrated) such as an IC chip and so on for driving and protection functions are bonded to the front surface of the printed circuit board 13. In the manufacturing procedure, the printed circuit board 13 may have a flat principal surface, or may have an outwardly warped front surface (hereinafter referred to as an upwardly warped principal surface) or an outwardly warped back surface (hereinafter referred to as a downwardly warped principal surface).

The ceramic circuit board 15 includes an insulating plate 15a, a metal plate formed on the back surface of the insulating plate 15a, and conductive patterns 15b1 to 15b6 formed on the front surface of the insulating plate 15a. Further, semiconductor elements 16a and 16b are bonded to the conductive patterns 15b3 and 15b4 of the ceramic circuit board 15.

Referring to the bottom part 11c of the case 11, as illustrated in FIGS. 12A and 12B, the adhesive 18 is applied to the back surface of the printed circuit board 13, and then the printed circuit board 13 is pressed against and bonded to the bottom part 11c of the case 11 with the adhesive 18 interposed therebetween.

Next, an example of the adhesive 18 with which the printed circuit board 13 is bonded to the bottom part 11c of the case 11 will be described with reference to FIGS. 13 to 15B.

FIG. 13 is a plan view illustrating an adhesive in the conventional semiconductor device.

FIGS. 14A and 14B are cross-sectional views illustrating the conventional semiconductor device with a printed circuit board having a flat principal surface mounted therein. FIGS. 15A and 15B are cross-sectional views illustrating the conventional semiconductor device with a printed circuit board having an upwardly warped principal surface mounted therein.

Note that the broken line in FIG. 13 indicates the position of the adhesive 18 interposed between the printed circuit board 13 and the bottom part 11c. Note that the cross sections illustrated in FIGS. 14A and 15A are taken along the one-dot chain line X-X of FIG. 13, and the cross sections illustrated in FIGS. 14B and 15B are taken along the one-dot chain line Y-Y of FIG. 13.

First, the adhesive 18 pressed by the printed circuit board 13 against the bottom part 11c spreads in all directions on the bottom part 11c. In this case, as illustrated in FIGS. 13, 14A, and 15A, the adhesive 18 does not spread to the opposite edges of the printed circuit board 13 in the long-side direction, so that the printed circuit board 13 and the bottom part 11c are partially unbonded. In particular, if the printed circuit board 13 is warped upward, as illustrated in FIG. 15A, the adhesive 18 remains at the center of the printed circuit board 13 in the long-side direction, and hence the printed circuit board 13 and the bottom part 11c are more likely to be partially unbounded.

Meanwhile, at each of the opposite edges of the printed circuit board 13 in the short-side direction, the adhesive 18 pressed by the printed circuit board 13 spreads on the bottom part 11c in the short-side direction. Then, as illustrated in FIGS. 13, 14B, and 15B, the adhesive 18 extends into the gap between the printed circuit board 13 and the terminal block 11b, and the gap between the ceramic circuit board 15 and the opening 11d.

Next, a description will be given of mounting of the downwardly warped printed circuit board 13 onto the bottom part 11c of the case 11, with reference to FIGS. 16A, 16B, 17A, and 17B.

FIGS. 16A and 16B are cross-sectional views illustrating the conventional semiconductor device in which a printed circuit board having a downwardly warped principal surface is weakly pressed. FIGS. 17A and 17B are cross-sectional views illustrating the conventional semiconductor device in which a printed circuit board having a downwardly warped principal surface is strongly pressed. Note that the cross sections illustrated in FIGS. 16A and 17A are taken along the one-dot chain line X-X of FIG. 13, and the cross sections illustrated in FIGS. 16B and 17B are taken along the one-dot chain line Y-Y of FIG. 13.

The adhesive 18 is applied to the back surface of the downwardly warped printed circuit board 13, and then the printed circuit board 13 is pressed against the bottom part 11c of the case 11 with the adhesive 18 interposed therebetween. Then, the adhesive 18 pressed by the printed circuit board 13 spreads on the bottom part 11c of the case 11.

In this step, if the printed circuit board 13 insufficiently or weakly presses the bottom part 11c of the case 11, the adhesive 18 does not spread to the opposite edges of the printed circuit board 13 in the long-side direction, so that the printed circuit board 13 and the bottom part 11c are partially unbonded as illustrated in FIG. 16A.

In this case, as illustrated in FIG. 16B, the adhesive 18 spreads to the opposite edges of the printed circuit board 13 in the short-side direction, so that the printed circuit board 13 and the bottom part 11c of the case 11 are bonded.

On the other hand, if the printed circuit board 13 sufficiently or strongly presses the bottom part 11c of the case 11, the adhesive 18 spreads to the opposite edges of the printed circuit board 13 in the long-side direction as illustrated in FIG. 17A, so that the printed circuit board 13 and the bottom part 11c of the case 11 are bonded.

In this case, the adhesive 18 also spreads to the opposite edges of the printed circuit board 13 in the short-side direction. Then, as illustrated in FIG. 17B, the adhesive 18 extends into the gap between the printed circuit board 13 and the terminal block 11b, and the gap between the ceramic circuit board 15 and the opening 11d.

Moreover, since the printed circuit board 13 strongly presses the bottom part 11c of the case 11, the thickness of the adhesive 18 between the center of the back surface of the printed circuit board 13 and the bottom part 11c of the case 11 is reduced.

In the semiconductor device 100 described above, if the principal surface of the printed circuit board 13 is flat or upwardly warped, the printed circuit board 13 and the bottom part 11c are not bonded at the opposite edges of the printed circuit board 13 in the long-side direction, as illustrated in FIGS. 14A and 15A. Therefore, the printed circuit board 13 may be separated from the bottom part 11c of the case 11. Further, in this case, in the short-side direction of the printed circuit board 13, the adhesive 18 extends into the gap between the printed circuit board 13 and the terminal block 11b, and the gap between the ceramic circuit board 15 and the opening 11d. Consequently, the adhesive 18 extends onto the front surfaces of the printed circuit board 13 and the ceramic circuit board 15, and onto the internal connection terminals 12a2 to 12g2, as illustrated in FIGS. 14B and 15B. The adhesive 18 extending thereon covers the electronic components on the printed circuit board 13, the semiconductor elements 16a and 16b on the ceramic circuit board 15, and the internal connection terminals 12a2 to 12g2, so that the electronic components, the semiconductor elements 16a and 16b, and the internal connection terminals 12a2 to 12g2 are damaged. This reduces the reliability of the semiconductor device 100.

Further, in the semiconductor device 100 described above, if the printed circuit board 13 having a downwardly warped principal surface weakly presses the bottom part 11c of the case 11, the printed circuit board 13 and the bottom part 11c are not bonded at the opposite edges of the printed circuit board 13 in the long-side direction, as illustrated in FIG. 16A. Therefore, the printed circuit board 13 may be separated from the bottom part 11c of the case 11. On the other hand, if the printed circuit board 13 strongly presses the bottom part 11c of the case 11, the adhesive 18 extends into the gap between the printed circuit board 13 and the terminal block 11b, and the gap between the ceramic circuit board 15 and the opening 11d, in the short-side direction of the printed circuit board 13. Consequently, the adhesive 18 extends onto the front surfaces of the printed circuit board 13 and the ceramic circuit board 15, and onto the internal connection terminals 12a2 to 12g2, as illustrated in FIG. 17B. The adhesive 18 extending thereon covers the electronic components on the printed circuit board 13, the semiconductor elements 16a and 16b on the ceramic circuit board 15, and the internal connection terminals 12a2 to 12g2, so that the electronic components, the semiconductor elements 16a and 16b, and the internal connection terminals 12a2 to 12g2 are damaged. Moreover, the thickness of the adhesive 18 between the center of the back surface of the downwardly warped printed circuit board 13 and the bottom part 11c of the case 11 is reduced, as illustrated in FIGS. 17A and 17B. Therefore, the thickness of the adhesive 18 between the printed circuit board 13 and the bottom part 11c is insufficient, so that the printed circuit board 13 may be separated from the bottom part 11c of the case 11. This reduces the reliability of the semiconductor device 100.

SUMMARY OF THE INVENTION

According to one aspect, there is provided a printed circuit board having a rectangular shape in a plan view, and having front and rear surfaces; and a case having an installation area in which the printed circuit board is disposed, the printed circuit board being attached to the case using an adhesive bonding member that is interposed between the rear surface of the printed circuit board and the installation area of the case, the case having at least one projection that is disposed in the installation area, and that supports the printed circuit board to maintain a gap between the installation area of the case and the printed circuit board.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Several embodiments will be described below with reference to the accompanying drawings.

(a) First Embodiment

A semiconductor device according to a first embodiment will be described with reference to FIGS. 1, 2A, and 2B.

Figure 1:
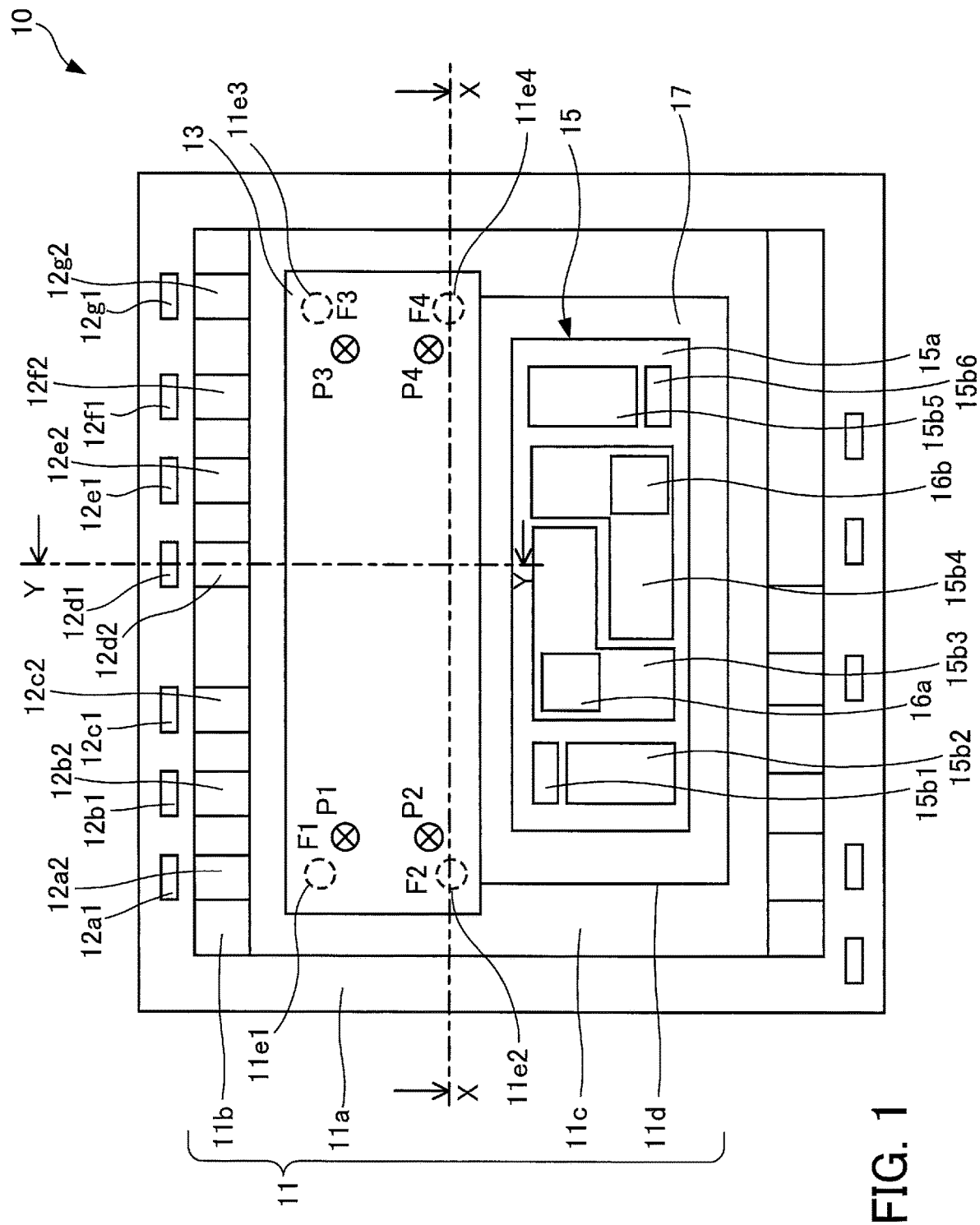
FIG. 1 is a plan view illustrating a semiconductor device according to a first embodiment.
Figure 2A:
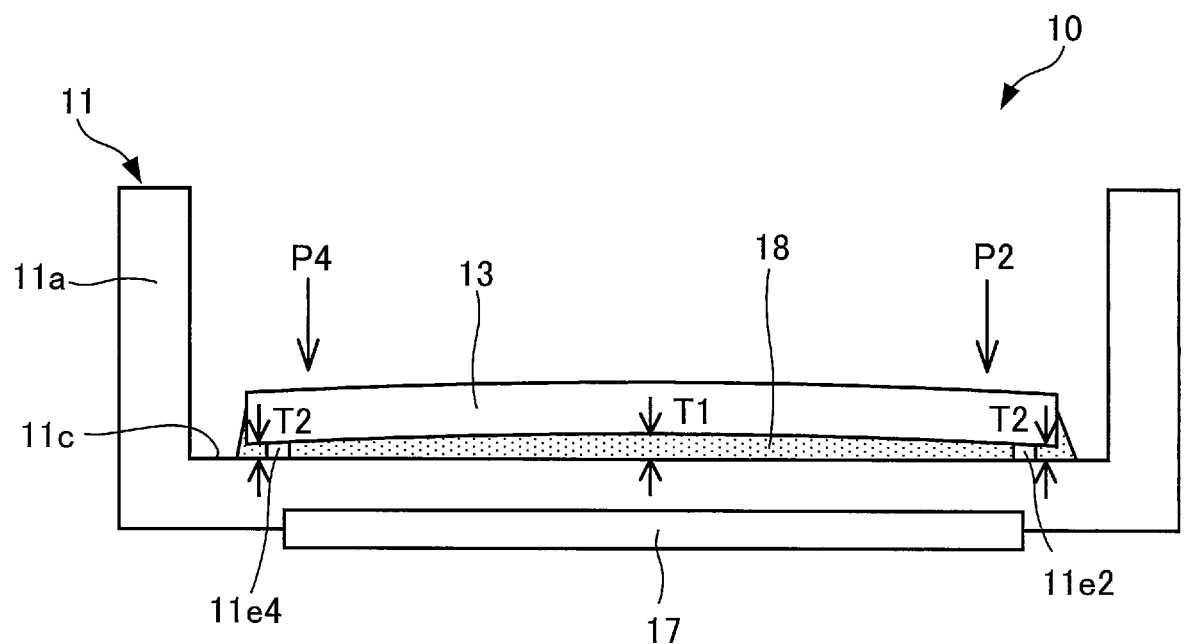
FIGS. 2A and 2B are cross-sectional views illustrating the semiconductor device according to the first embodiment.
Figure 2B:
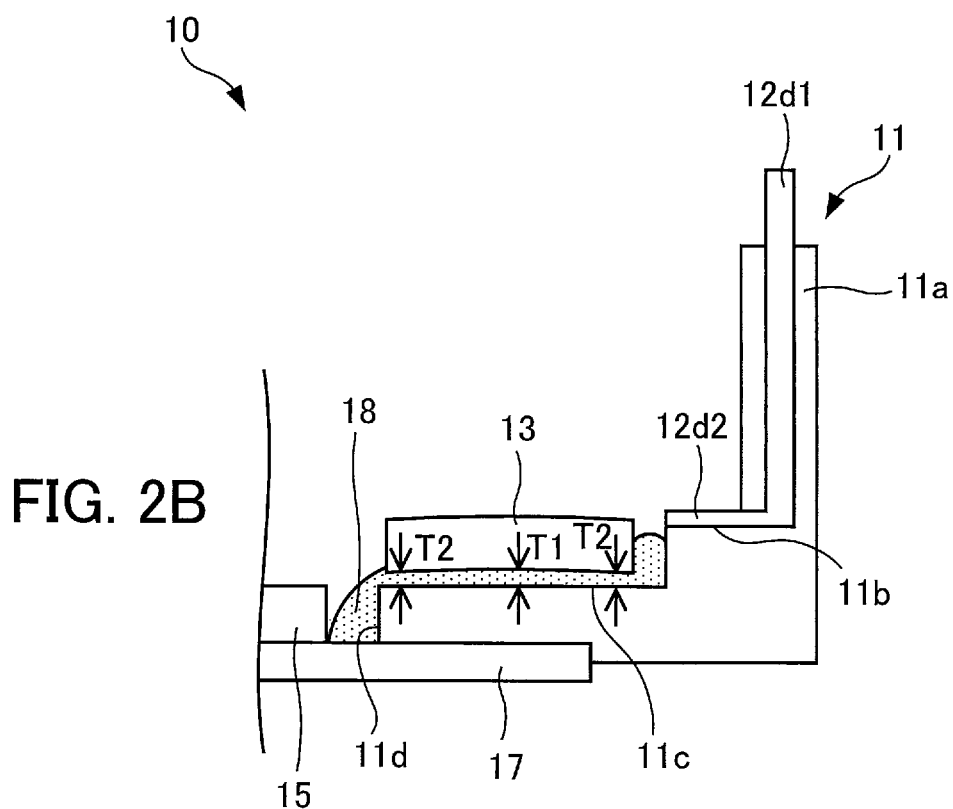

FIG. 1 is a plan view illustrating the semiconductor device according to the first embodiment, and FIGS. 2A and 2B are cross-sectional views illustrating the semiconductor device according to the first embodiment. Note that the cross section illustrated in FIG. 2A is taken along the one-dot chain line X-X of FIG. 1, and the cross section illustrated in FIG. 2B is taken along the one-dot chain line Y-Y of FIG. 1. In FIG. 2B, conductive patterns 15b1 to 15b6 of a ceramic circuit board 15 and semiconductor elements 16a and 16b are not illustrated.

A semiconductor device 10 includes a case 11, a printed circuit board 13 accommodated in the case 11, a ceramic circuit board 15, and an adhesive 18 for bonding the printed circuit board 13 to the case 11.

The case 11 includes a frame 11a surrounding the printed circuit board 13 and the ceramic circuit board 15, a terminal block 11b disposed on the inner side of the frame 11a, a bottom part 11c on which the printed circuit board 13 is disposed, and an opening 11d in which the ceramic circuit board 15 is disposed.

The case 11 further includes external connection terminals 12a1 to 12g1 formed on the frame 11a, and internal connection terminals 12a2 to 12g2 connected to the external connection terminals 12a1 to 12g1 in the frame 11a and disposed on the terminal block 11b. Note that in FIG. 2B, the external connection terminal 12d1 formed on the frame 11a and the internal connection terminal 12d2 connected to the external connection terminal 12d1 in the frame 11a and disposed on the terminal block 11b are illustrated.

Further, a metal base plate 17 is bonded from the back side of the opening 11d of the case 11, and the ceramic circuit board 15 is bonded by soldering (not illustrated) onto the metal base plate 17 in the opening 11d.

Further, projections 11e1 to 11e4 are formed at predetermined formation positions F1 to F4 (predetermined positions) in an installation area for the printed circuit board 13 on the bottom part 11c, near the respective corners of the printed circuit board 13. Note that in FIG. 1, the formation positions F1 to F4 of the projections 11e1 to 11e4 are indicated by the broken lines. The projections 11e1 to 11e4 will be hereinafter referred to as projections 11e when not distinguished from one another.

The case 11 is made of a thermosetting resin. Such a resin includes polyphenylene sulfide, polybutyrene terephthalate resin, polybutylene succinate resin, polyamide resin, acrylonitrile butadiene styrene resin, and the like.

The inside of the case 11 may be sealed by a sealing member (not illustrated). The sealing member is made of a thermosetting resin such as maleimide-modified epoxy resin, maleimide-modified phenol resin, maleimide resin, and the like, for example. Alternatively, the sealing member may be made of gel.

The printed circuit board 13 includes an insulating plate made of a resin such as epoxy resin, phenol resin, and the like, and a conductive pattern (not illustrated) formed on the front surface of the insulating plate. Further, various electronic components (not illustrated) such as an IC chip and so on are disposed on the front surface of the printed circuit board 13. The electronic components are electrically connected by the conductive pattern. With this printed circuit board 13, a drive circuit is formed. Further, as will be described below, the printed circuit board 13 of the first embodiment is warped upward such that the peak is located on the front side of the printed circuit board 13. The interconnects of the printed circuit board 13 and the internal connection terminals 12a2 to 12g2 are respectively electrically connected by bonding wires (not illustrated). Note that in FIGS. 1, 2A, and 2B, P1 to P4 on the printed circuit board 13 indicate the pressing positions where the printed circuit board 13 is pressed when mounting the printed circuit board 13 on the bottom part 11c.

The adhesive 18 includes a thermosetting resin adhesive mainly containing epoxy resin, phenol resin, or the like, and an organic adhesive such as an elastomeric adhesive mainly containing silicone rubber, chloroprene rubber, or the like.

The ceramic circuit board 15 includes an insulating plate 15a, a metal plate (not illustrated) formed on the back surface of the insulating plate 15a, and conductive patterns 15b1 to 15b6 formed on the front surface of the insulating plate 15a.

The insulating plate 15a is made of highly thermal conductive ceramics, such as aluminum oxide, aluminum nitride, silicon nitride, and the like.

The metal plate is made of a metal having a high thermal conductivity, such as aluminum, iron, silver, copper, an alloy containing at least one of these metals, and the like.

The conductive patterns 15b1 to 15b6 are made of a metal having a high electrical conductivity, such as copper, copper alloy, and the like. Further, the semiconductor elements 16a and 16b are bonded to the conductive patterns 15b3 and 15b4 by soldering (not illustrated).

The ceramic circuit board 15 having the configuration described above may be a direct copper bonding (DCB) substrate, active metal brazed (AMB) substrate, for example. The ceramic circuit board 15 is able to conduct heat generated in the semiconductor elements 16a and 16b toward the metal base plate 17 via the conductive patterns 15b1 to 15b6, the insulating plate 15a, and the metal plate.

The semiconductor elements 16a and 16b include a switching element such as an IGBT, a power MOSFET, and the like, for example. Such semiconductor elements 16a and 16b are provided with, for example, a drain electrode or a collector electrode as a main electrode on the back surface, and a gate electrode and one of a source electrode and an emitter electrode as main electrodes on the front surface.

Further, the semiconductor elements 16a and 16b include a diode such as a Schottky barrier diode (SBD), a freewheeling diode (FWD), and the like as needed. Such semiconductor elements 16a and 16b are provided with a cathode electrode as a main electrode on the back surface, and an anode electrode as a main electrode on the front surface.

The back surfaces of the semiconductor elements 16a and 16b are bonded to the conductive patterns 15b3 and 15b4, respectively, by silver-based, gold-based, copper-based, or tin-based, lead-free solder (not illustrated), for example. The semiconductor elements 16a and 16b may be provided in plurality without being limited thereto, and appropriately bonded to the conductive patterns 15b1 to 15b6.

On the ceramic circuit board 15, the conductive patterns 15b1 to 15b6 are electrically connected to each other, and the conductive patterns 15b1 to 15b6 are appropriately electrically connected to the semiconductor elements 16a and 16b, by bonding wires (not illustrated). Thus, a predetermined circuit including the semiconductor elements 16a and 16b is formed.

The metal base plate 17 is made of, for example, aluminum, iron, silver, copper, an alloy containing at least one of these metals, an aluminum-silicon carbide composite, or a magnesium-silicon carbide composite, having a high thermal conductivity. In order to improve the corrosion resistance, a material such as nickel and the like may be deposited on the surface of the metal base plate 17 by plating, for example. Examples of the material include nickel-phosphorus alloy, nickel-boron alloy, and so on, other than nickel.

The metal plate of the ceramic circuit board 15 is bonded to the metal base plate 17 by silver-based, gold-based, copper-based, or tin-based, lead-free solder, for example.

In order to improve the heat radiation performance, a cooler (not illustrated) may be bonded to the back surface of the metal base plate 17 by soldering, silver brazing, or the like, or may be mechanically attached with thermal paste or the like. In this case, the cooler is made of aluminum, iron, silver, copper, an alloy containing at least one of these metals, or the like, having a high thermal conductivity, for example. Further, a fin or a heatsink including a plurality of fins, and a water-cooled cooling system or the like may be used as the cooler. The metal base plate 17 may be formed integrally with the cooler. In this case, the metal base plate 17 is made of aluminum, iron, silver, copper, an alloy containing at least one of these metals, or the like, having a high thermal conductivity. In order to improve the corrosion resistance, a material such as nickel and the like may be deposited on the surface of a radiator plate, which is formed integrally with the cooler, by plating, for example. Examples of the material include nickel-phosphorus alloy, nickel-boron alloy, and so on, other than nickel.

A description will be given of installation of the printed circuit board 13 on the bottom part 11c of the case 11 in the semiconductor device 10 having the configuration described above, with reference to FIG. 3 together with FIGS. 1, 2A, and 2B.

Figure 3:
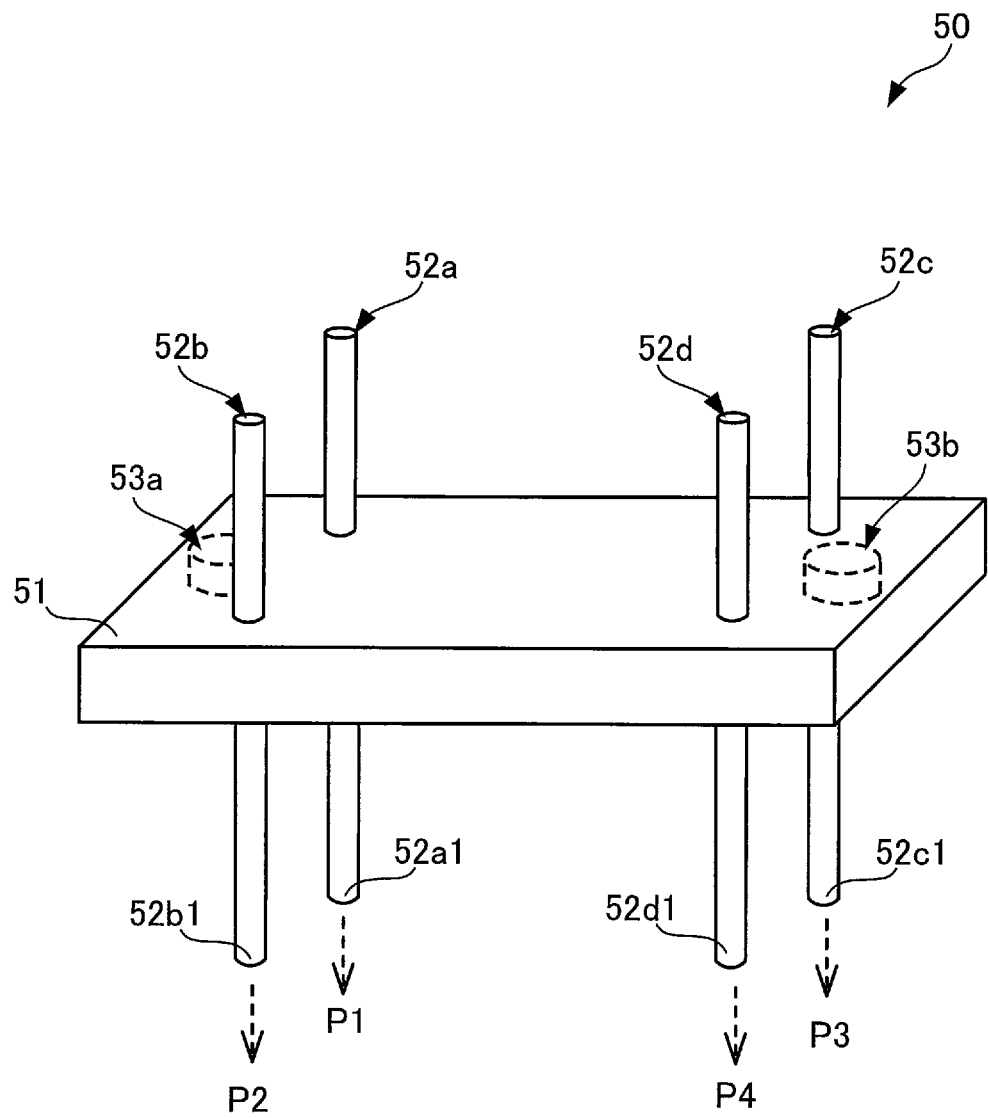
FIG. 3 illustrates an example of a pressing jig for a printed circuit board according to the first embodiment.

FIG. 3 illustrates an example of a pressing jig for a printed circuit board according to the first embodiment.

Figure 12A:
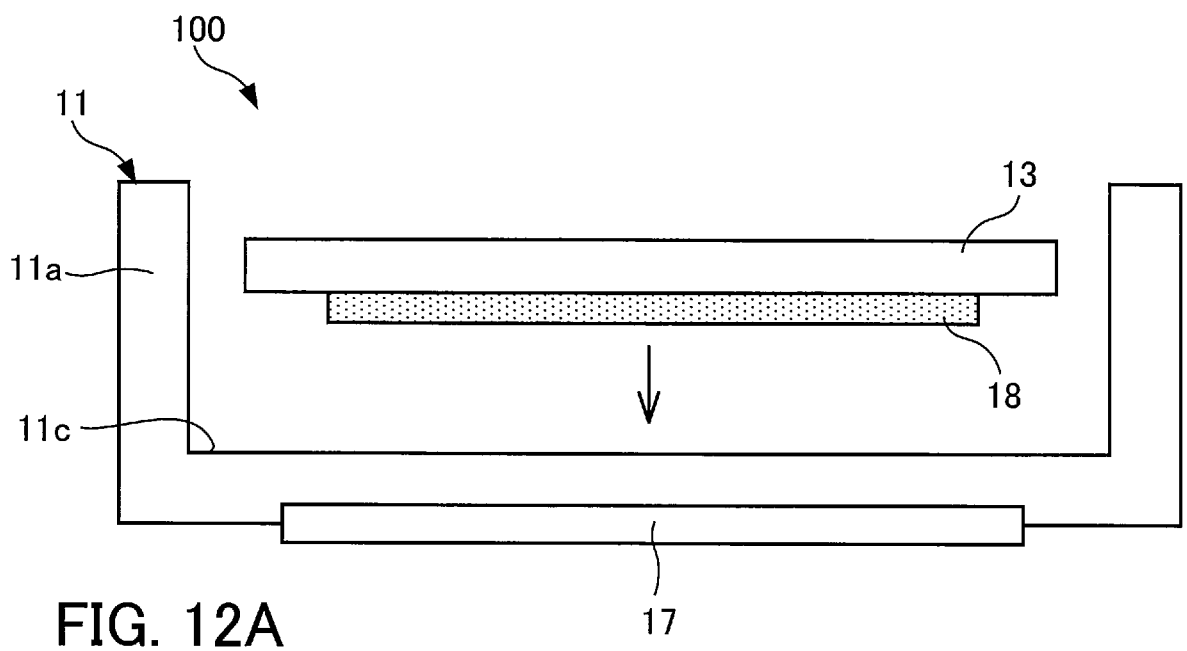
FIGS. 12A and 12B are cross-sectional views illustrating mounting of a printed circuit board in the conventional semiconductor device.
Figure 12B:
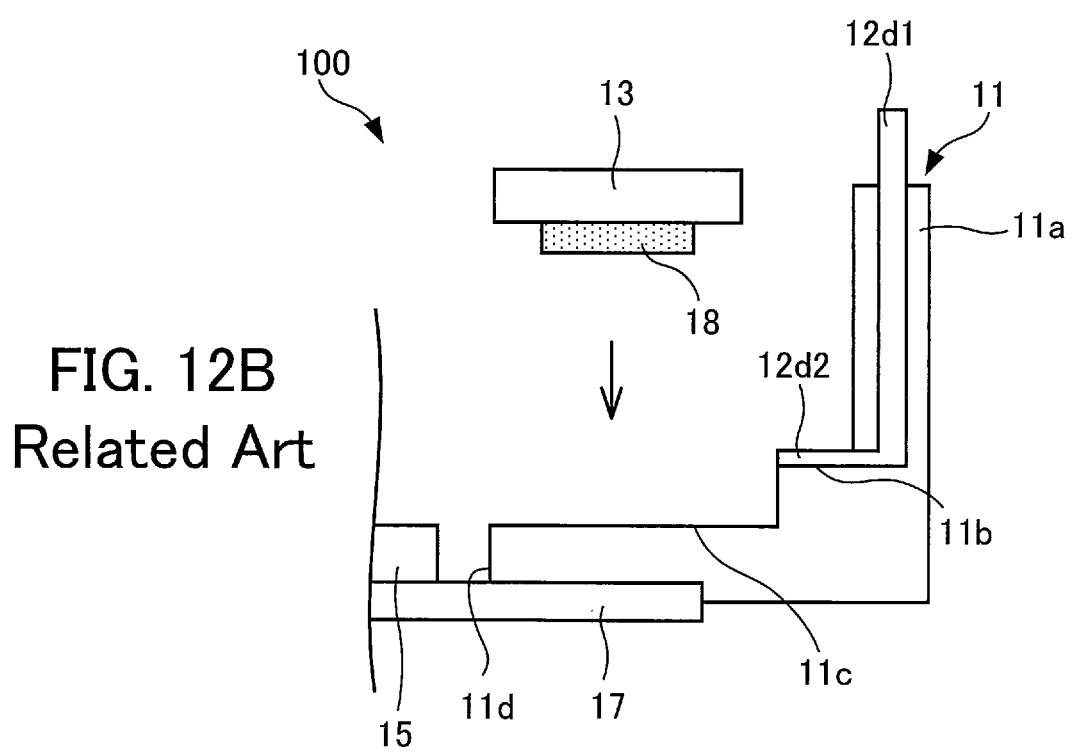
Figure 13:
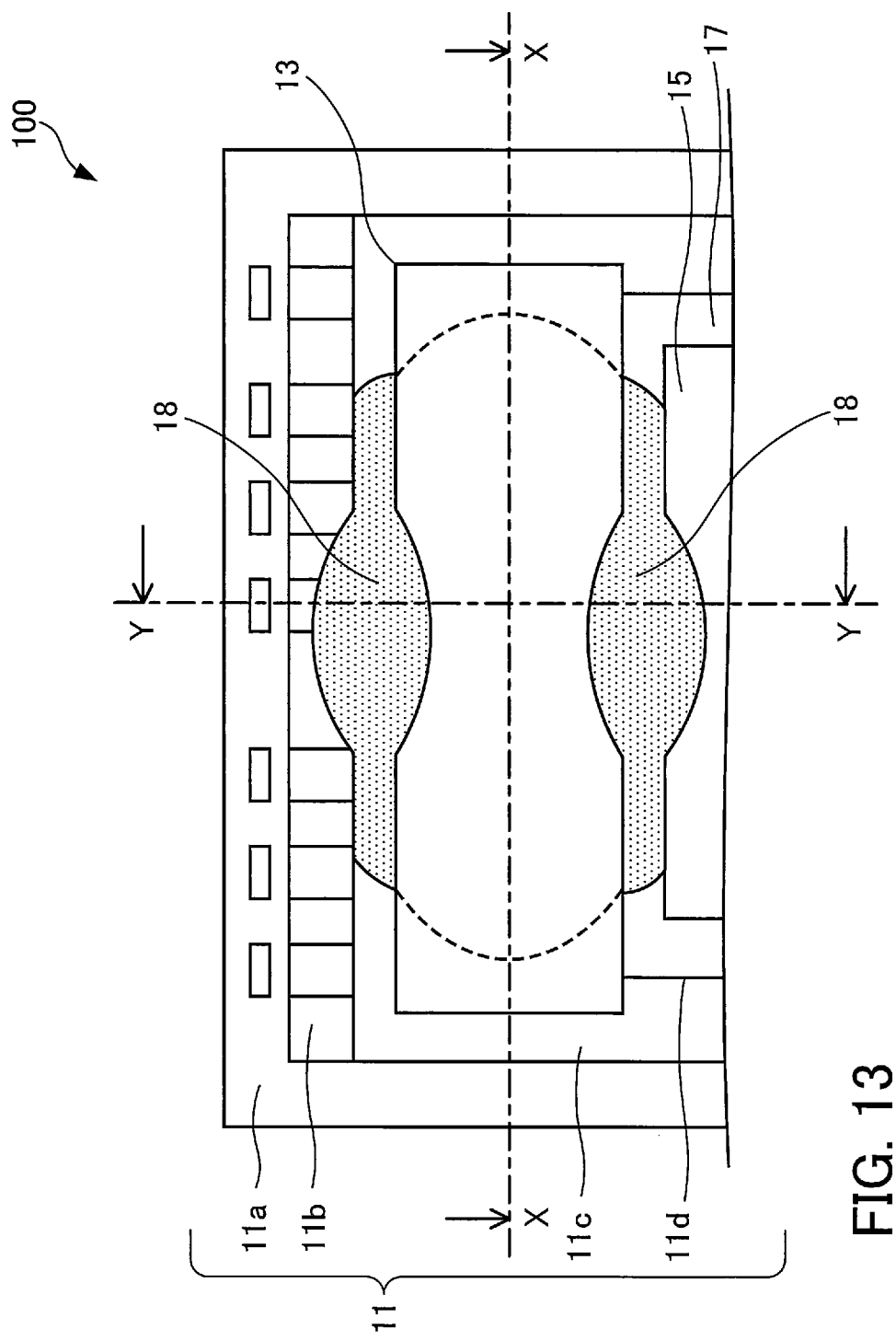
FIG. 13 is a plan view illustrating an adhesive in the conventional semiconductor device.
Figure 14A:
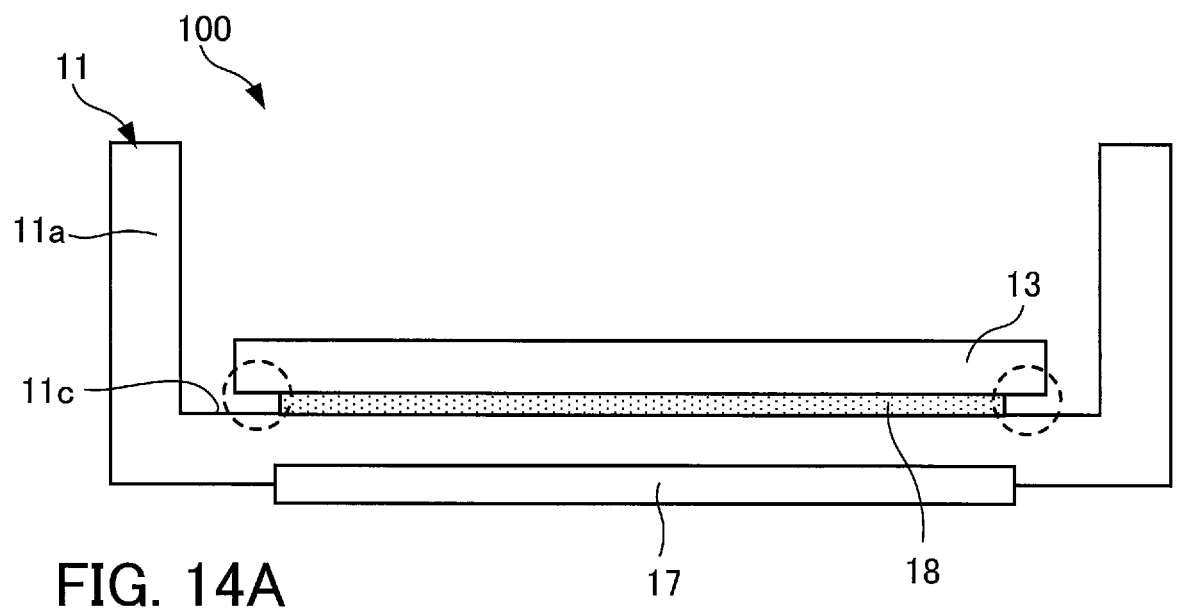
FIGS. 14A and 14B are cross-sectional views illustrating the conventional semiconductor device with a printed circuit board having a flat principal surface mounted therein.
Figure 14B:
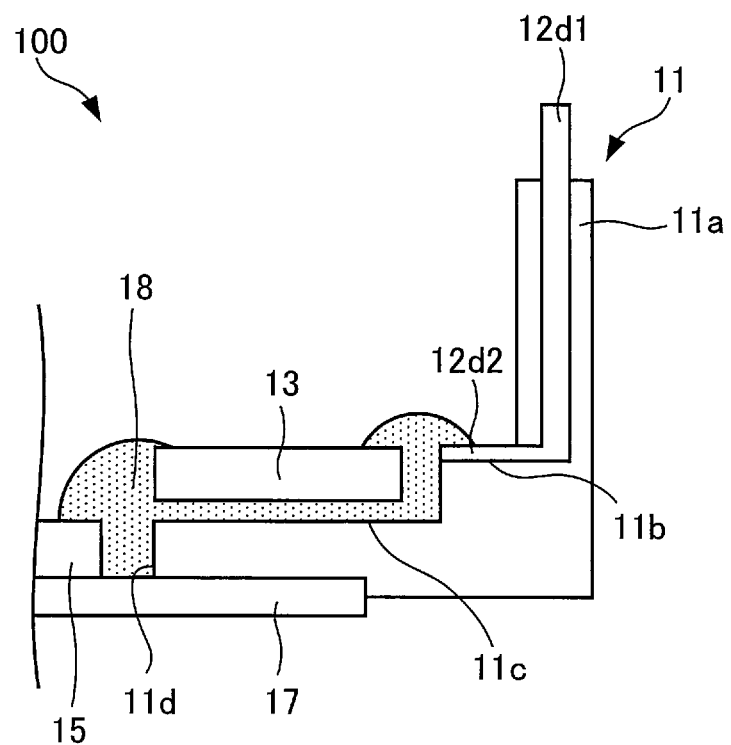
Figure 15A:
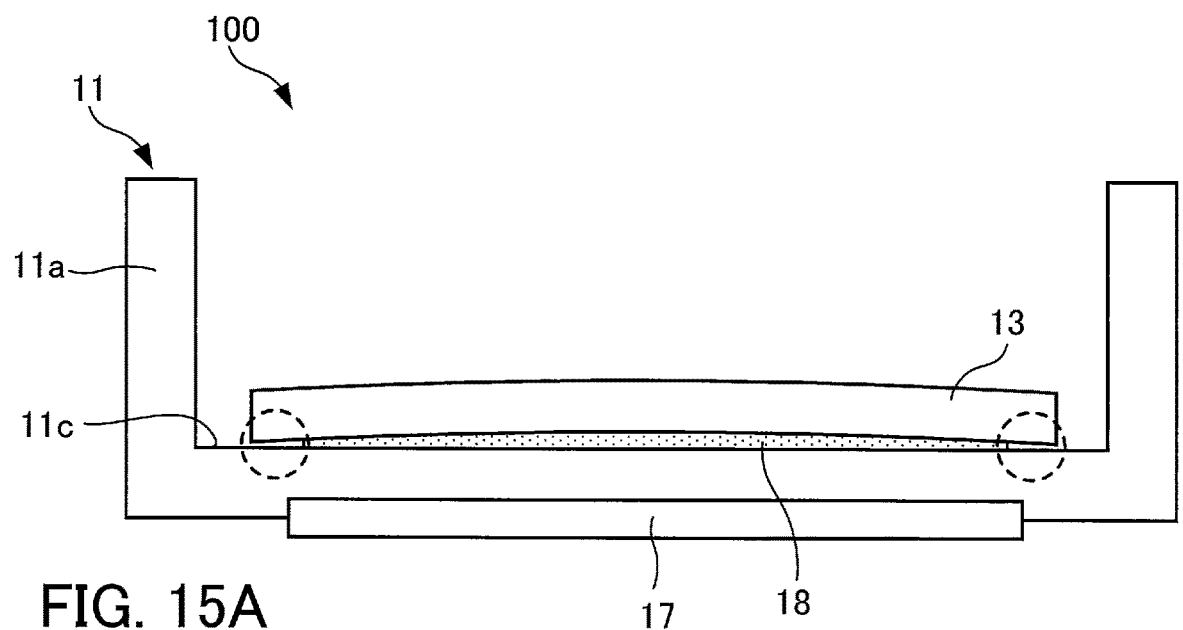
FIGS. 15A and 15B are cross-sectional views illustrating the conventional semiconductor device with a printed circuit board having an upwardly warped principal surface mounted therein.
Figure 15B:
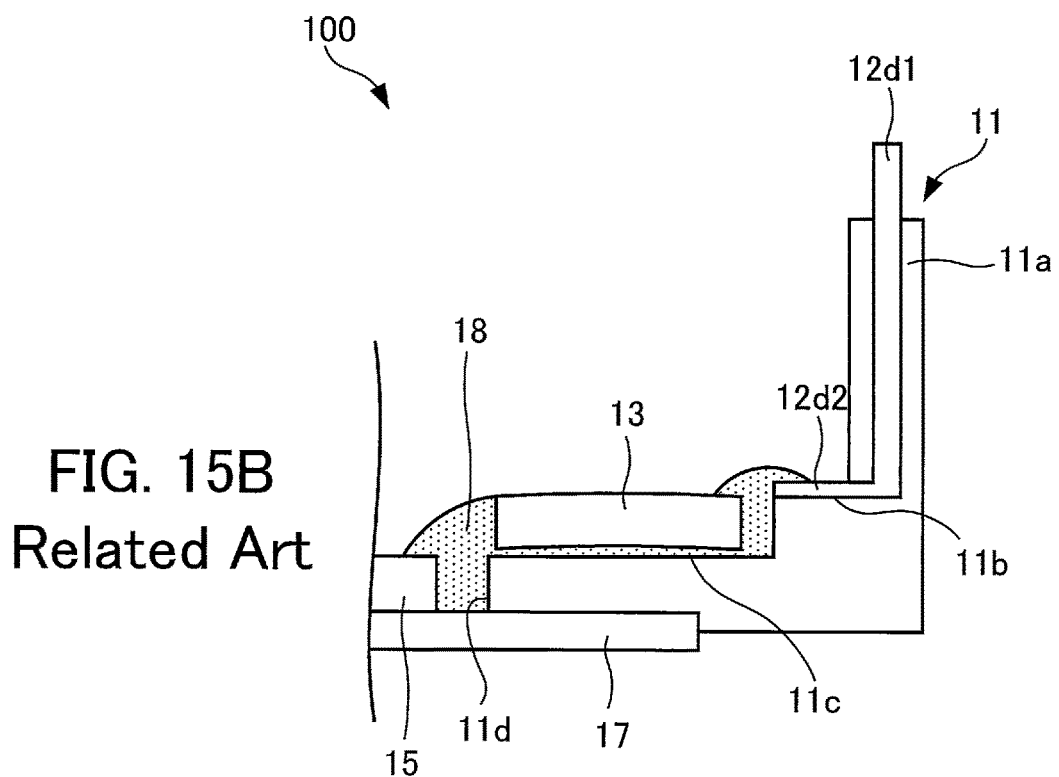
Figure 16A:
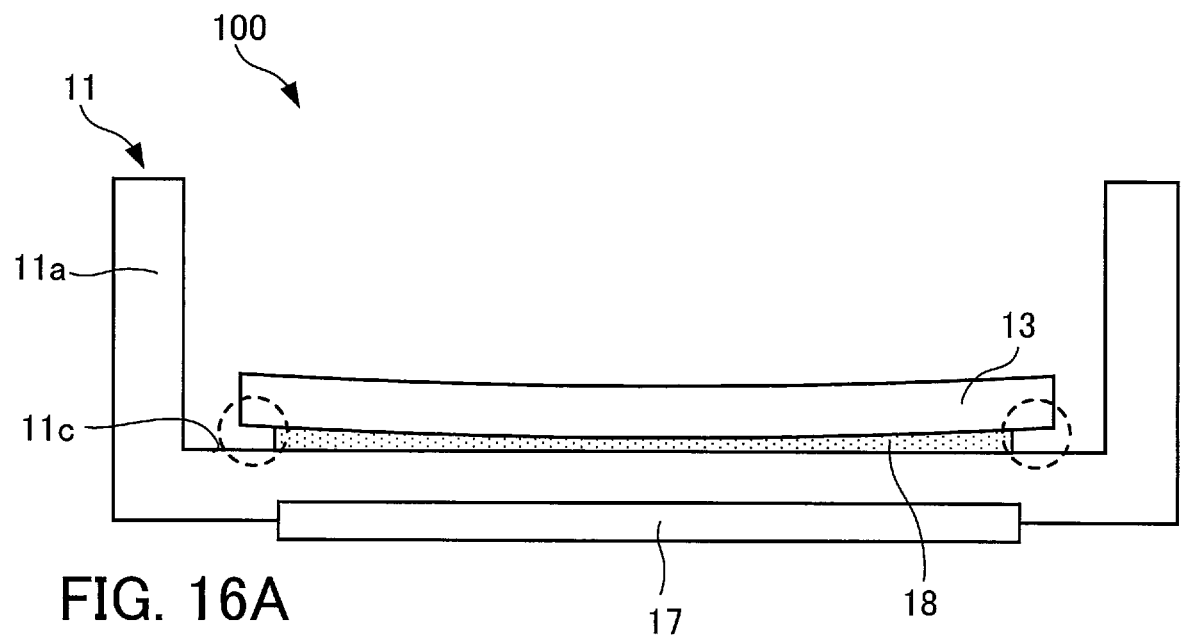
FIGS. 16A and 16B are cross-sectional views illustrating the conventional semiconductor device in which a printed circuit board having a downwardly warped principal surface is weakly pressed.
Figure 16B:
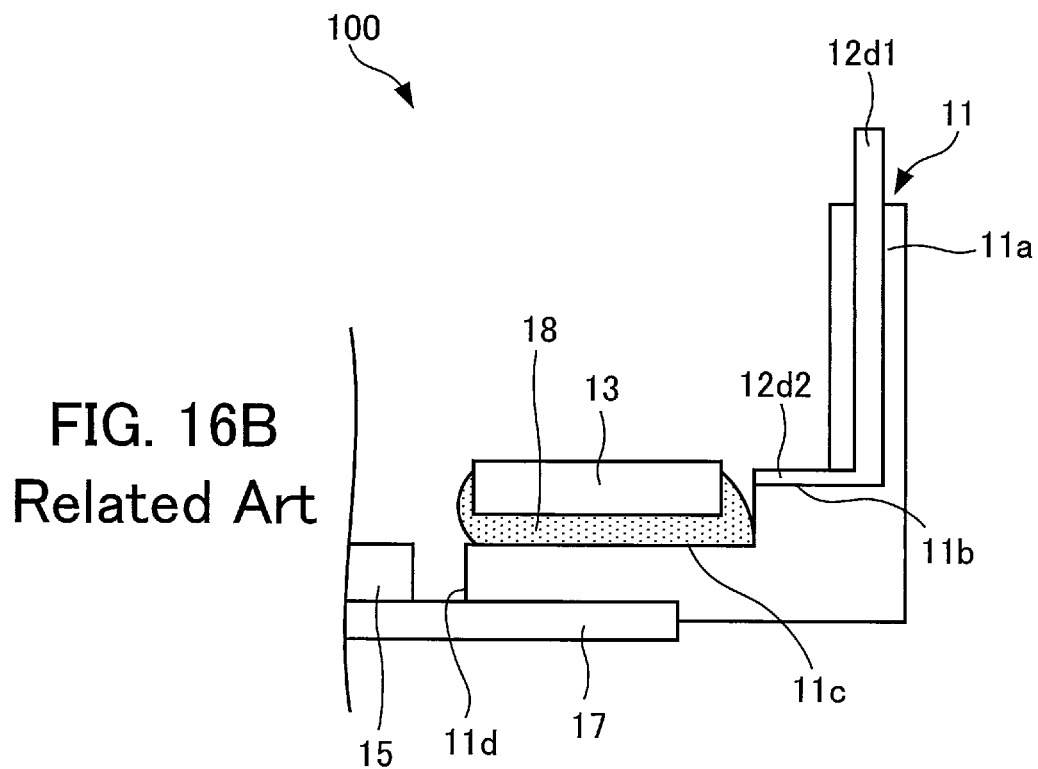
Figure 17A:
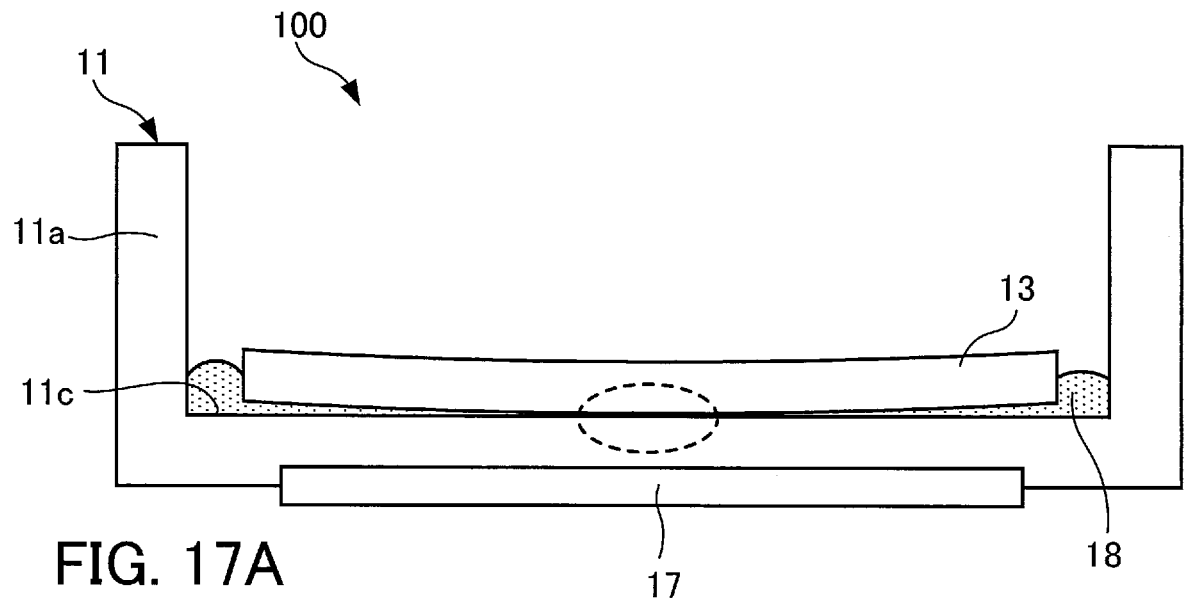
FIGS. 17A and 17B are cross-sectional views illustrating the conventional semiconductor device in which a printed circuit board having a downwardly warped principal surface is strongly pressed.
Figure 17B:
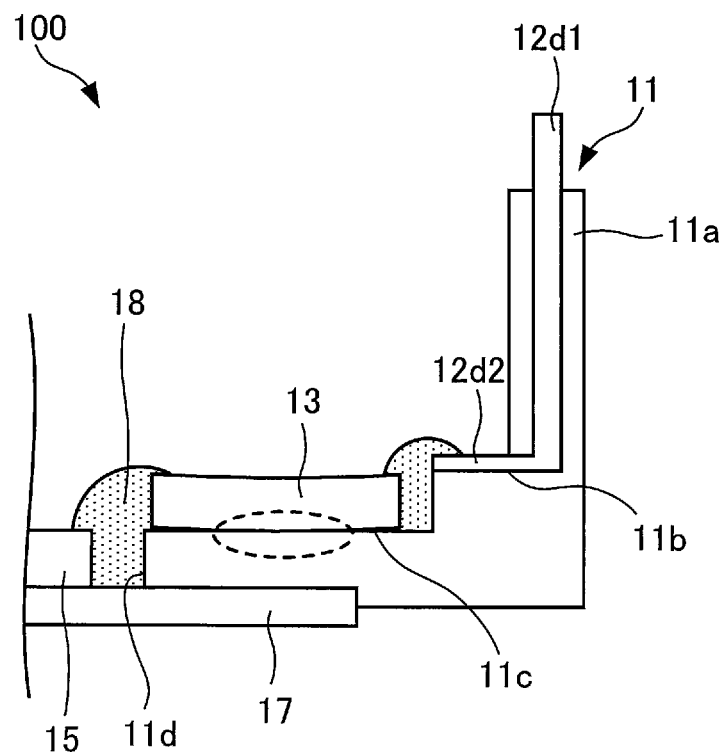

First, the adhesive 18 is applied to the back surface of the upwardly warped printed circuit board 13, which faces the bottom part 11c of the case 11, as illustrated in FIGS. 12A and 12B. Alternatively, the adhesive 18 may be applied to the installation area for the printed circuit board 13 on the bottom part 11c of the case 11. The adhesive 18 may be applied with an arbitrary method known in the art, such as a screen printing method using a mask, a liquid dispensing method using a syringe, and the like.

Then, the printed circuit board 13 is installed in the installation area on the bottom part 11c. In this step, the corners of the back surface of the printed circuit board 13 are respectively supported by the projections 11e1 to 11e4 formed on the bottom part 11c.

Further, a pressing apparatus (not illustrated) to which a pressing jig 50 illustrated in FIG. 3 is attached is prepared in advance. In the pressing jig 50, pressing pins 52a to 52d are formed at the positions in a pin fixing part 51 corresponding to the pressing positions P1 to P4 of the printed circuit board 13. The positions where the pressing pins 52a to 52d are formed in the pin fixing part 51 and the number of pressing pins 52a to 52d are not limited thereto, and an arbitrary number of pressing pins 52a to 52d may be formed at arbitrary positions in the pin fixing part 51 to correspond to the pressing positions of the printed circuit board 13. The pressing jig 50 is attached at its attachment portions 53a and 53b to a pressing part of the pressing apparatus. The pressing part of the pressing apparatus moves in the direction perpendicular to the principal surface of the case 11 that is installed as will be described below.

The case 11 with the printed circuit board 13 installed on the bottom part 11c is placed in a predetermined area of the pressing apparatus. Then, the pressing apparatus lowers the pressing part to bring pressing portions 52a1 to 52d1 of the pressing pins 52a to 52d of the pressing jig 50 into contact with the respective pressing positions P1 to P4 of the printed circuit board 13 all at once. In this step, the pressing positions P1 to P4 of the upwardly warped printed circuit board 13 are located on the inner side of the projections 11e1 to 11e4, as illustrated in FIG. 1.

Then, the pressing apparatus presses the printed circuit board 13. The pressing apparatus keeps pressing until the adhesive 18 cures. The pressing positions P1 to P4 of the printed circuit board 13 that are located on the inner side of the projections 11e1 to 11e4 on the bottom part 11c are pressed while the back surface of the printed circuit board 13 is supported by the projections 11e1 to 11e4. Therefore, the warpage of the printed circuit board 13 is reduced. In this step, the pressing apparatus presses the printed circuit board 13 such that the printed circuit board 13 remains slightly warped. Then, as the printed circuit board 13 is pressed, the adhesive 18 is pressed and spread on the bottom part 11c of the case 11. Since the back surface of the thus pressed printed circuit board 13 is supported by the projections 11e1 to 11e4 on the bottom part 11c, a gap having a height substantially corresponding to the height of the projections 11e1 to 11e4 is maintained between the printed circuit board 13 and the bottom part 11c.

Therefore, as illustrated in FIG. 2A, at each of the opposite edges of the printed circuit board 13 in the long-side direction, the end of the adhesive 18 is located between the back surface and the front surface on the side surface of the edge of the printed circuit board 13.

Further, as illustrated in FIG. 2B, at each of the opposite edges of the printed circuit board 13 in the short-side direction, the end of the adhesive 18 is located between the back surface and the front surface on the side surface of the edge of the printed circuit board 13.

As illustrated in FIGS. 2A and 2B, the adhesive 18 extends slightly beyond the edges of the printed circuit board 13. However, the adhesive 18 extending beyond the opposite edges of the printed circuit board 13 does not extend over the front surface of the printed circuit board 13, the internal connection terminals 12d2, or the front surface of the ceramic circuit board 15. Note that the adhesive 18 extending beyond the opposite edges of the printed circuit board 13 does not extend over the internal connection terminals 12a2 and 12c2 to 12g2, either.

The adhesive 18 that is pressed and spread between the printed circuit board 13 and the bottom part 11c has a maximum thickness T1 at the center thereof, and has a minimum thickness T2 at the outer periphery thereof. If the thickness T1 is too large, separation inside the layer of the adhesive 18 due to a crack defect is more likely to occur. Therefore, the thickness T1 is preferably less than or equal to 0.30 mm, and more preferably less than or equal to 0.20 mm. On the other hand, if the thickness T2 is too small, separation between the printed circuit board 13 and the bottom part 11c is more likely to occur. Therefore, the thickness T2 is preferably greater than or equal to 0.04 mm, and more preferably greater than or equal to 0.06 mm.

The semiconductor device 10 described above includes the printed circuit board 13 having a rectangular shape in plan view, and the case 11 in which the projections 11e1 to 11e4 are formed at the formation positions F1 to F4 in the installation area where the printed circuit board 13 is disposed with the adhesive 18 interposed therebetween. The projections 11e1 to 11e4 support the printed circuit board 13 from the back surface side thereof to maintain a gap of a predetermined distance ranging from T1 to T2 between the installation area and the back surface.

Accordingly, when the printed circuit board 13 is pressed against the bottom part 11c of the case 11 with the adhesive 18 interposed therebetween, the back surface of the printed circuit board 13 is supported by the projections 11e1 to 11e4 formed on the bottom part 11c. Therefore, the gap between the printed circuit board 13 and the bottom part 11c is maintained to have a height substantially corresponding to the height of the projections 11e1 to 11e4, so that the adhesive 18 pressed by the printed circuit board 13 spreads over the entire back surface of the printed circuit board 13. Further, the adhesive 18 is prevented from spreading excessively beyond the back surface of the printed circuit board 13. Consequently, at each of the opposite edges of the printed circuit board 13 in each of the long-side direction and the short-side direction, the end of the adhesive 18 is located between the back surface and the front surface on the side surface of the edge of the printed circuit board 13. Therefore, the adhesive 18 extending beyond the edges of the printed circuit board 13 does not extend over the front surface of the printed circuit board 13, the internal connection terminals 12a2 to 12g2, or the front surface of the ceramic circuit board 15.

Accordingly, there is no unbonded area between the printed circuit board 13 and the bottom part 11c, and the gap between the printed circuit board 13 and the bottom part 11c maintains a height that ensures the adhesive force of the adhesive 18 therebetween. Therefore, the printed circuit board 13 is prevented from being separated from the bottom part 11c. Further, the front surface of the printed circuit board 13, the front surface of the ceramic circuit board 15, and the internal connection terminals 12a2 to 12g2 are prevented from being damaged by the adhesive 18. These prevent a reduction in reliability of the semiconductor device 10.

Now, the projection 11e will be described with reference to FIGS. 4A and 4B.

Figure 4B:
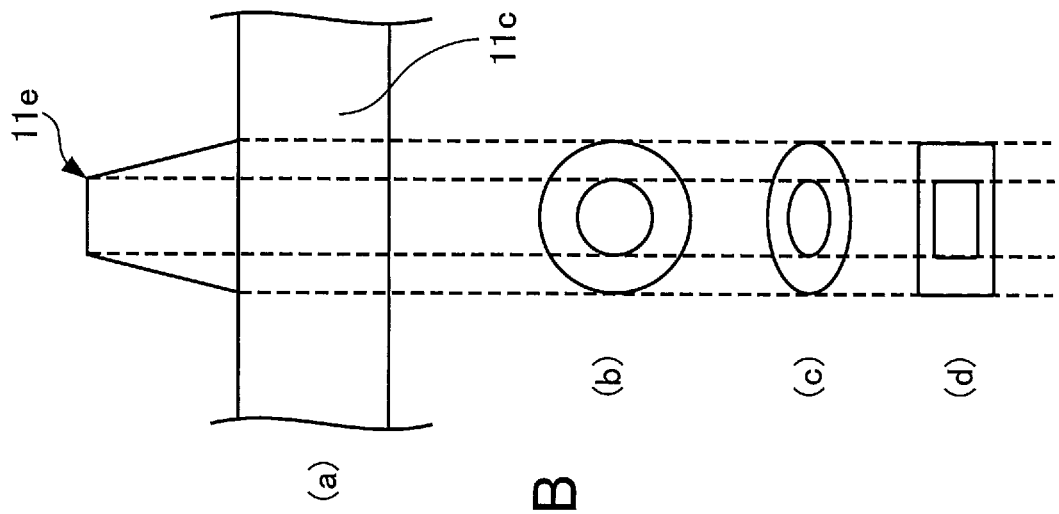
FIGS. 4A and 4B illustrate a projection of the semiconductor device according to the first embodiment.
Figure 4A:
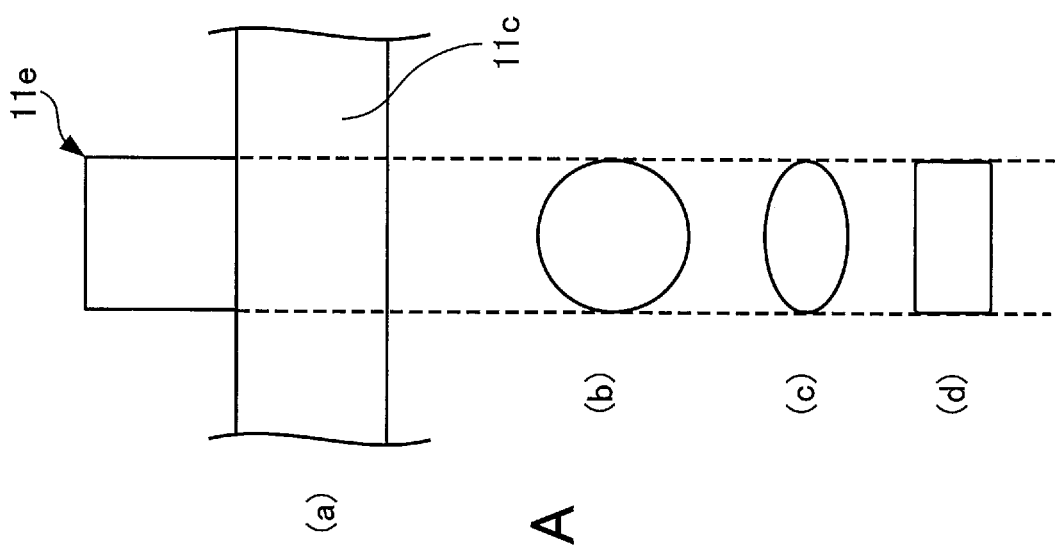

FIGS. 4A and 4B illustrate a projection of the semiconductor device according to the first embodiment.

Each projection 11e supports the printed circuit board 13 from the back surface thereof as described above. The projection 11e preferably has a shape and size that does not prevent the adhesive 18 from flowing and that does not generate a void.

The projection 11e preferably has a rectangular shape in a cross section perpendicular to the principal surface of the bottom part 11c of the case 11 as illustrated in (a) of FIG. 4A. If its height is too large, the printed circuit board 13 is likely to be positioned excessively high when the printed circuit board 13 is disposed on the bottom part 11c. On the other hand, if its height is too small, it is not possible to ensure the thickness of the adhesive 18 needed for bonding. The height that satisfies these requirements is preferably greater than or equal to 0.08 mm and less than or equal to 0.15 mm. For example, the height is 0.1 mm.

Further, as illustrated in (b), (c), and (d) of FIG. 4A, the projection 11e preferably has a circular, elliptical, or rectangular shape in a cross section parallel to the principal surface of the bottom part 11c of the case 11. For example, in the case where the projection 11e has a circular cross-sectional shape, if its diameter is too small, the projection 11e is likely to incline when supporting the printed circuit board 13. On the other hand, if its diameter is too large, the area bonded by the adhesive 18 is reduced. The diameter that satisfies these requirements is preferably greater than or equal to 0.5 mm and less than or equal to 1.5 mm. For example, the diameter is 1 mm. The projection 11e having an elliptical or rectangular cross-sectional shape preferably has the same size, or same width, as the projection 11e having a circular-cross sectional shape.

Also, as illustrated in (a) of FIG. 4B, the projection 11e may have a trapezoidal shape in a cross section perpendicular to the principal surface of the bottom part 11c of the case 11. As in the case of FIG. 4A, the height is preferably greater than or equal to 0.08 mm and less than or equal to 0.15 mm. For example, the height is 0.1 mm.

Further, as illustrated in (b), (c), and (d) of FIG. 4B, the projection 11e has a circular, elliptical, or rectangular shape in a cross section parallel to the principal surface of the bottom part 11c of the case 11. For example, in the case where the projection 11e has a circular cross-sectional shape, that is, a truncated cone shape, as illustrated in (b) of FIG. 4B, the diameter of the lower base is preferably greater than or equal to 0.5 mm and less than or equal to 1.5 mm, as in the case of FIG. 4A. For example, the diameter is 1 mm. Similarly, the diameter of the upper base is preferably greater than or equal to 0.2 mm and less than or equal to 1.0 mm. For example, the diameter is 0.7 mm. In addition, in the case where the projection 11e having an elliptical or rectangular cross-sectional shape, it is preferable that the upper and lower bases thereof have the same sizes in width as described above for those of the projection 11e having a circular-cross sectional shape.

Next, examples of the arrangement positions of projections formed on the bottom part 11c of the case 11 will be described with reference to FIGS. 5A and 5B.

Figure 5A:
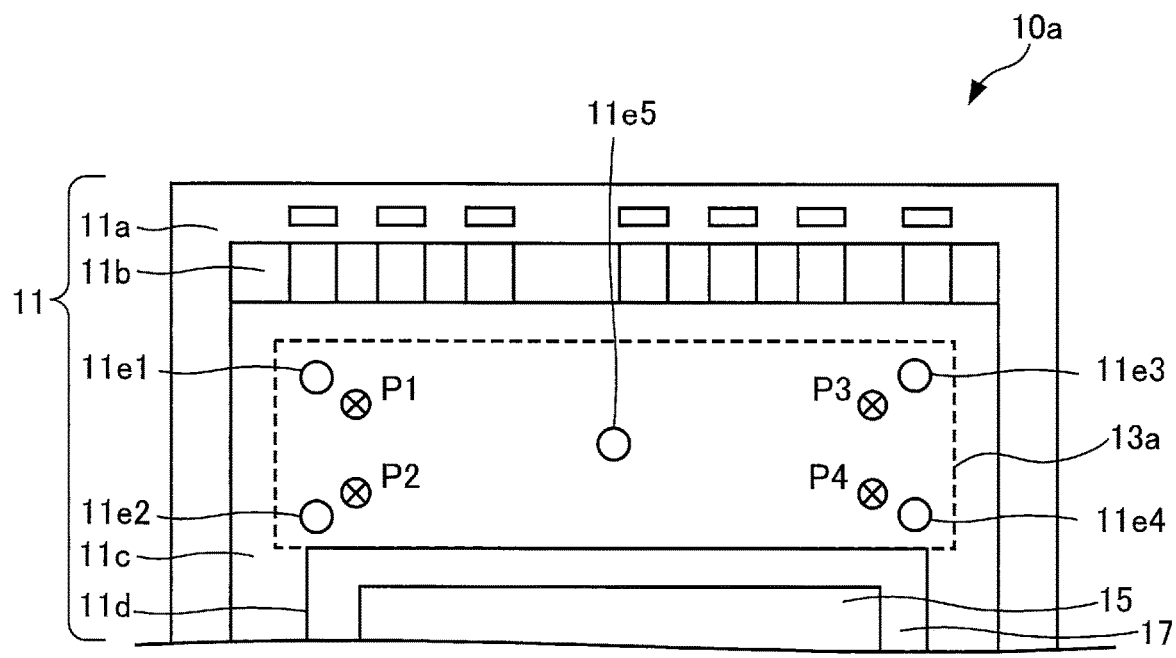
FIGS. 5A and 5B illustrate the arrangement positions of projections in the semiconductor device according to the first embodiment.
Figure 5B:
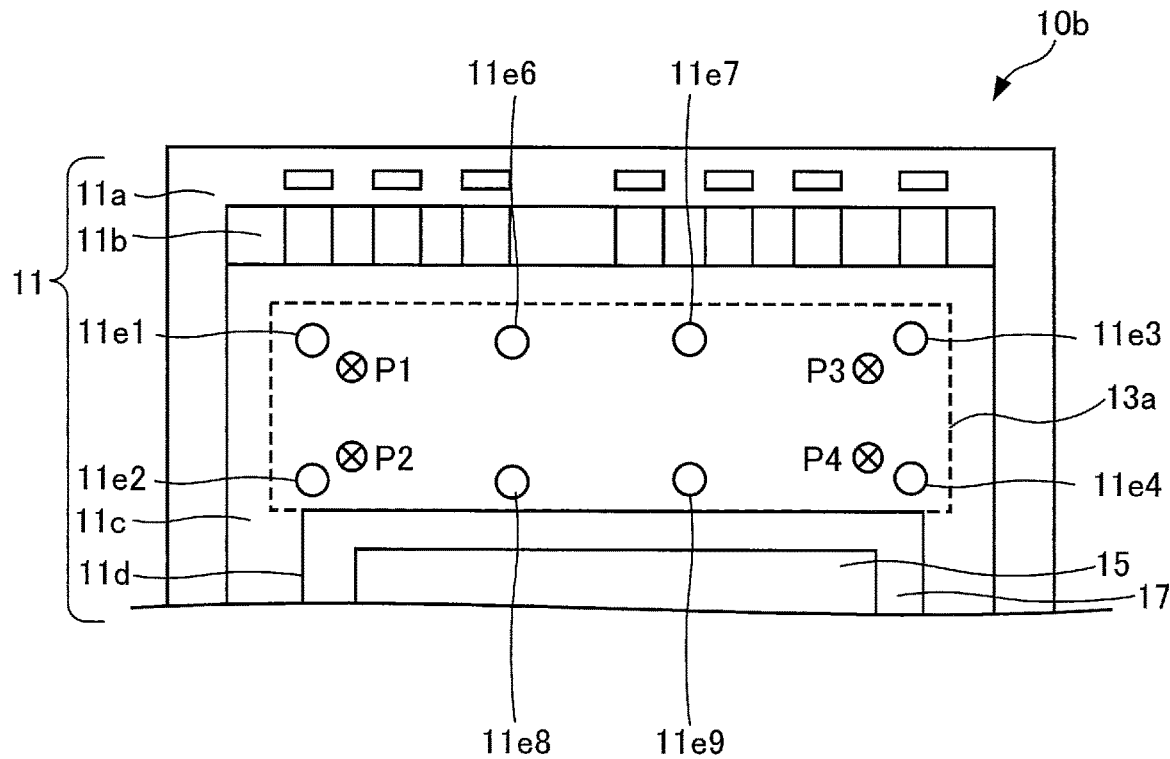

FIGS. 5A and 5B illustrate the arrangement positions of projections in the semiconductor device according to the first embodiment. Note that in FIGS. 5A and 5B, the installation area for the printed circuit board 13 is indicated by the broken line.

A semiconductor device 10a illustrated in FIG. 5A is obtained by further forming a projection 11e5 at the center of an installation area 13a for the printed circuit board 13 on the bottom part 11c of the semiconductor device 10.

The pressing positions P1 to P4 of the upwardly warped printed circuit board 13 are pressed against the installation area 13a on the bottom part 11c of the case 11 by the pressing jig 50 attached to the pressing apparatus, in the manner described with reference to FIGS. 1 to 3. The pressing positions P1 to P4 of the printed circuit board 13 that are located on the inner side of the projections 11e1 to 11e4 in the installation area 13a on the bottom part 11c are pressed while the back surface of the printed circuit board 13 is supported by the projections 11e1 to 11e4. Therefore, the warpage is reduced. For example, even if the pressing force is increased, the printed circuit board 13 is fixed to the bottom part 11c by the adhesive 18 in a manner such that the center of the back surface of the printed circuit board 13 is supported by the projection 11e5 in the installation area 13a.

A semiconductor device 10b illustrated in FIG. 5B is obtained by further forming projections 11e6 to 11e9 on the bottom part 11c of the semiconductor device 10. These projections 11e6 to 11e9 are formed at positions spaced apart by a predetermined distance from the respective corners of the installation area 13a toward the inner side in the long-side direction. That is, the projections 11e6 and 11e7 are formed between the projections 11e1 and 11e3, and the projections 11e8 and 11e9 are formed between the projections 11e2 and 11e4.

In this case as well, the pressing positions P1 to P4 of the upwardly warped printed circuit board 13 are pressed against the installation area 13a on the bottom part 11c of the case 11 by the pressing jig 50 attached to the pressing apparatus, in the manner described with reference to FIGS. 1 to 3. The warpage of the printed circuit board 13 is reduced as described above. For example, even if the pressing force is increased, the printed circuit board 13 is fixed to the bottom part 11c by the adhesive 18 in a manner such that the opposite edges of the back surface of the printed circuit board 13 is supported by the projections 11e6 and 11e7 and the projections 11e8 and 11e9.

In the case where projections other than the projections 11e1 to 11e4 are further formed, the number of projections that are further formed is preferably four or less. If the number of projections that are further formed is too large, the area bonded by the adhesive 18 is reduced.

In the case of the semiconductor devices 10a and 10b of FIGS. 5A and 5B, as in the case of the semiconductor device 10, the adhesive 18 spreads over the entire back surface of the printed circuit board 13. Further, the adhesive 18 is prevented from spreading excessively beyond the back surface of the printed circuit board 13. At each of the opposite edges of the printed circuit board 13 in each of the long-side direction and the short-side direction, the end of the adhesive 18 is located between the back surface and the front surface on the side surface of the edge of the printed circuit board 13. Therefore, the adhesive 18 extending beyond the edges of the printed circuit board 13 does not extend over the front surface of the printed circuit board 13, the internal connection terminals 12a2 to 12g2, or the front surface of the ceramic circuit board 15.

Accordingly, in the semiconductor devices 10a and 10b, there is no unbonded area between the printed circuit board 13 and the bottom part 11c, and the gap between the printed circuit board 13 and the bottom part 11c maintains a height that ensures the adhesive force of the adhesive 18 therebetween. Therefore, the printed circuit board 13 is prevented from being separated from the bottom part 11c. Further, the front surface of the printed circuit board 13, the front surface of the ceramic circuit board 15, and the internal connection terminals 12a2 to 12g2 are prevented from being damaged by the adhesive 18. These prevent a reduction in reliability of the semiconductor devices 10a and 10b.

Further, in the case of the semiconductor devices 10a and 10b of FIGS. 5A and 5B, the projection 11e5 and the projections 11e6 to 11e9 are further formed, respectively. Therefore, even if the pressing force is increased, the gap between the printed circuit board 13 and the bottom part 11c is maintained. Further, the adhesive 18 is prevented from spreading excessively beyond the back surface of the printed circuit board 13. Therefore, the reliability of the semiconductor devices 10a and 10b is further improved.

(b) Second Embodiment

Figure 6:
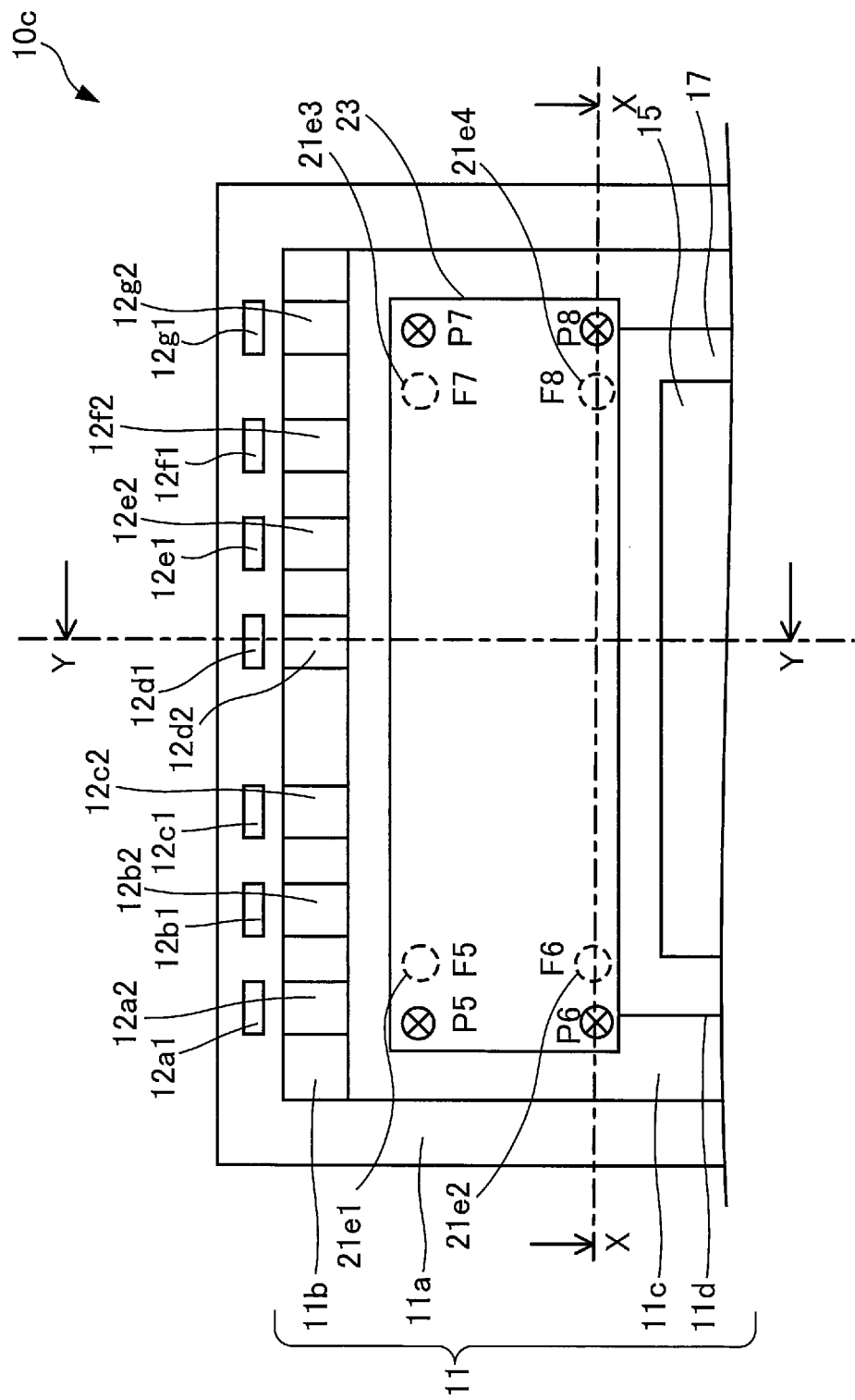
FIG. 6 is a plan view illustrating a semiconductor device according to a second embodiment.
Figure 7A:
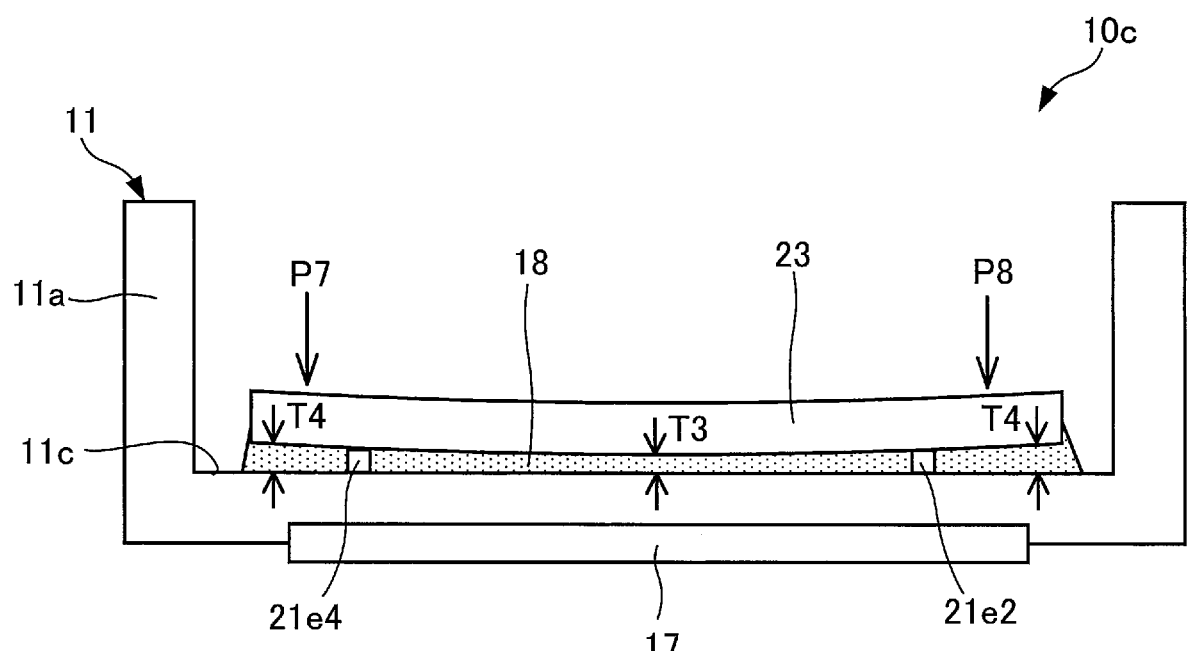
FIGS. 7A and 7B are cross-sectional views illustrating the semiconductor device according to the second embodiment.
Figure 7B:
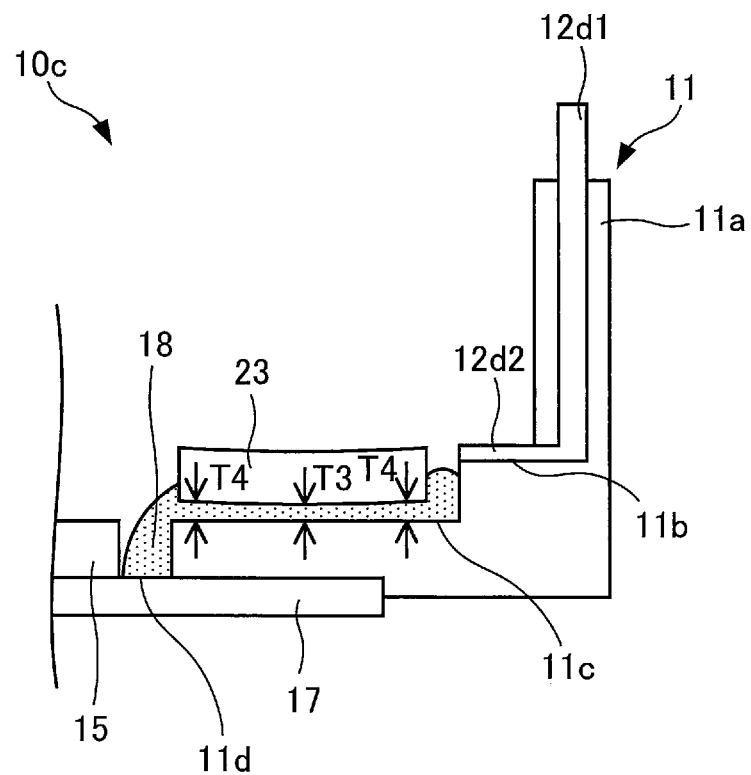

A second embodiment describes the case where a printed circuit board that is warped downward with the peak located on the back side of the printed circuit board is disposed in the installation area on the bottom part 11c of the case 11, with reference to FIGS. 6, 7A and 7B.

FIG. 6 is a plan view illustrating a semiconductor device according to the second embodiment, and FIGS. 7A and 7B are cross-sectional views illustrating the semiconductor device according to the second embodiment. Note that the cross section illustrated in FIG. 7A is taken along the one-dot chain line X-X of FIG. 6, and the cross section illustrated in FIG. 7B is taken along the one-dot chain line Y-Y of FIG. 6.

Similar to the semiconductor device 10 illustrated in FIGS. 1 to 3, a semiconductor device 10c includes a case 11, and a printed circuit board 23 and a ceramic circuit board 15 accommodated in the case 11. However, the printed circuit board 23 is warped downward. In FIG. 6, P5 to P8 on the printed circuit board 23 indicate the pressing positions where the printed circuit board 23 is pressed when mounting the printed circuit board 23 on the bottom part 11c.

Projections 21e1 to 21e4 are formed in an installation area for the printed circuit board 23 on the bottom part 11c, and are spaced apart by a predetermined distance from the respective corners of the printed circuit board 23. Note that in FIG. 6, the formation positions F5 to F8 of the projections 21e1 to 21e4 are indicated by the broken lines. Further, the projections 21e1 to 21e4 will be hereinafter referred to as projections 21e when not distinguished from one another.

Next, a description will be given of installation of the printed circuit board 23 in the installation area on the bottom part 11c of the case 11 in the semiconductor device 10c having the configuration described above, with reference to FIGS. 6, 7A and 7B.

First, as in the case of the first embodiment, the adhesive 18 is applied to the back surface of the downwardly warped printed circuit board 23, which faces the bottom part 11c of the case 11, as illustrated in FIGS. 12A and 12B, for example. Alternatively, the adhesive 18 may be applied to the installation area for the printed circuit board 23 on the bottom part 11c of the case 11.

Then, the printed circuit board 23 is installed in the installation area on the bottom part 11c. In this step, the portions near the corners of the back surface of the printed circuit board 23 are respectively supported by the projections 21e1 to 21e4 formed on the bottom part 11c.

The case 11 with the printed circuit board 23 installed in the installation area on the bottom part 11c is placed in a predetermined area of the pressing apparatus with the pressing jig 50 of FIG. 3 attached thereto. Note that the pressing pins 52a to 52d of the pressing jig 50 are positioned to correspond to the pressing positions P5 to P8 of the printed circuit board 23. Then, the pressing apparatus lowers the pressing part to bring the pressing portions 52a1 to 52d1 of the pressing pins 52a to 52d of the pressing jig 50 into contact with the respective pressing positions P5 to P8 of the printed circuit board 23. In this step, the pressing positions P5 to P8 of the downwardly warped printed circuit board 23 are located on the outer side of the projections 21e1 to 21e4, as illustrated in FIG. 6.

Then, the pressing apparatus presses the printed circuit board 23. The pressing apparatus keeps pressing until the adhesive 18 cures. The pressing positions P5 to P8 of the printed circuit board 23 that are located on the outer side of the projections 21e1 to 21e4 on the bottom part 11c are pressed while the back surface of the printed circuit board 23 is supported by the projections 21e1 to 21e4. Therefore, the warpage of the printed circuit board 23 is reduced. In this step, the pressing apparatus presses the printed circuit board 23 such that the printed circuit board 23 remains slightly warped. Then, as the printed circuit board 23 is pressed, the adhesive 18 is pressed and spread on the bottom part 11c of the case 11. Since the back surface of the thus pressed printed circuit board 23 is supported by the projections 21e1 to 21e4 on the bottom part 11c, a gap having a height substantially corresponding to the height of the projections 21e1 to 21e4 is maintained between the printed circuit board 23 and the bottom part 11c.

Therefore, as illustrated in FIG. 7A, at each of the opposite edges of the printed circuit board 23 in the long-side direction, the end of the adhesive 18 is located between the back surface and the front surface on the side surface of the edge of the printed circuit board 23.

Further, as illustrated in FIG. 7B, at each of the opposite edges of the printed circuit board 23 in the short-side direction, the end of the adhesive 18 is located between the back surface and the front surface on the side surface of the edge of the printed circuit board 23.

As illustrated in FIGS. 7A and 7B, the adhesive 18 extends slightly beyond the edges of the printed circuit board 23. However, the adhesive 18 extending beyond the opposite edges of the printed circuit board 23 does not extend over the front surface of the printed circuit board 23, the internal connection terminals 12d2, or the front surface of the ceramic circuit board 15. Note that the adhesive 18 extending beyond the opposite edges of the printed circuit board 23 does not extend over the internal connection terminals 12a2 and 12c2 to 12g2, either.

The adhesive 18 that is thus pressed and spread between the printed circuit board 23 and the bottom part 11c has a minimum thickness T3 at the center thereof, and has a maximum thickness T4 at the outer periphery thereof. If the thickness T3 is too small, separation between the printed circuit board 23 and the bottom part 11c is more likely to occur. Therefore, the thickness T3 is preferably greater than or equal to 0.04 mm, and more preferably greater than or equal to 0.06 mm. On the other hand, if the thickness T4 is too large, separation inside the adhesive layer due to a crack defect is more likely to occur. Therefore, the thickness T4 is preferably less than or equal to 0.30 mm, and more preferably less than or equal to 0.20 mm.

The semiconductor device 10c described above includes the printed circuit board 23 having a rectangular shape in plan view, and the case 11 in which the projections 21e1 to 21e4 are formed at the formation positions F5 to F8 in the installation area where the printed circuit board 23 is disposed with the adhesive 18 interposed therebetween. The projections 21e1 to 21e4 support the printed circuit board 23 from the back surface side thereof to maintain a gap of a predetermined distance ranging from T3 to T4 between the installation area and the back surface.

Accordingly, when the printed circuit board 23 with the adhesive 18 applied to the back surface thereof is pressed against the bottom part 11c of the case 11, the printed circuit board 23 is supported from the back surface side thereof by the projections 21e1 to 21e4 formed on the bottom part 11c. Therefore, the gap between the printed circuit board 23 and the bottom part 11c is maintained to have a height substantially corresponding to the height of the projections 21e1 to 21e4, so that the adhesive 18 pressed by the printed circuit board 23 spreads over the entire back surface of the printed circuit board 23. Further, the adhesive 18 is prevented from spreading excessively beyond the back surface of the printed circuit board 23. Consequently, at each of the opposite edges of the printed circuit board 23 in each of the long-side direction and the short-side direction, the end of the adhesive 18 is located between the back surface and the front surface on the side surface of the edge of the printed circuit board 23. Therefore, the adhesive 18 extending beyond the edges of the printed circuit board 23 does not extend over the front surface of the printed circuit board 23, the internal connection terminals 12a2 to 12g2, or the front surface of the ceramic circuit board 15.

Accordingly, there is no unbonded area between the printed circuit board 23 and the bottom part 11c, and the gap between the printed circuit board 23 and the bottom part 11c maintains a height that ensures the adhesive force of the adhesive 18 therebetween. Therefore, the printed circuit board 23 is prevented from being separated from the bottom part 11c. Further, the front surface of the printed circuit board 23, the front surface of the ceramic circuit board 15, and the internal connection terminals 12a2 to 12g2 are prevented from being damaged by the adhesive 18. These prevent a reduction in reliability of the semiconductor device 10c.

Next, examples of the arrangement positions of projections formed on the bottom part 11c of the case 11 will be described with reference to FIGS. 8A and 8B.

Figure 8A:
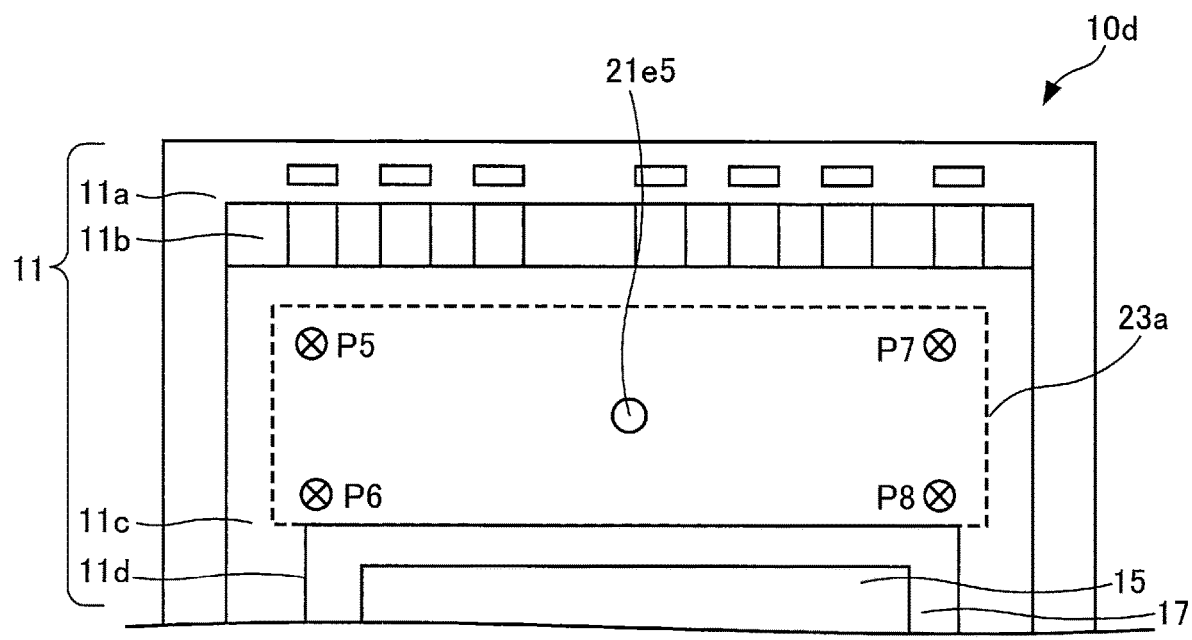
FIGS. 8A and 8B illustrate the arrangement positions of projections in the semiconductor device according to the second embodiment.
Figure 8B:
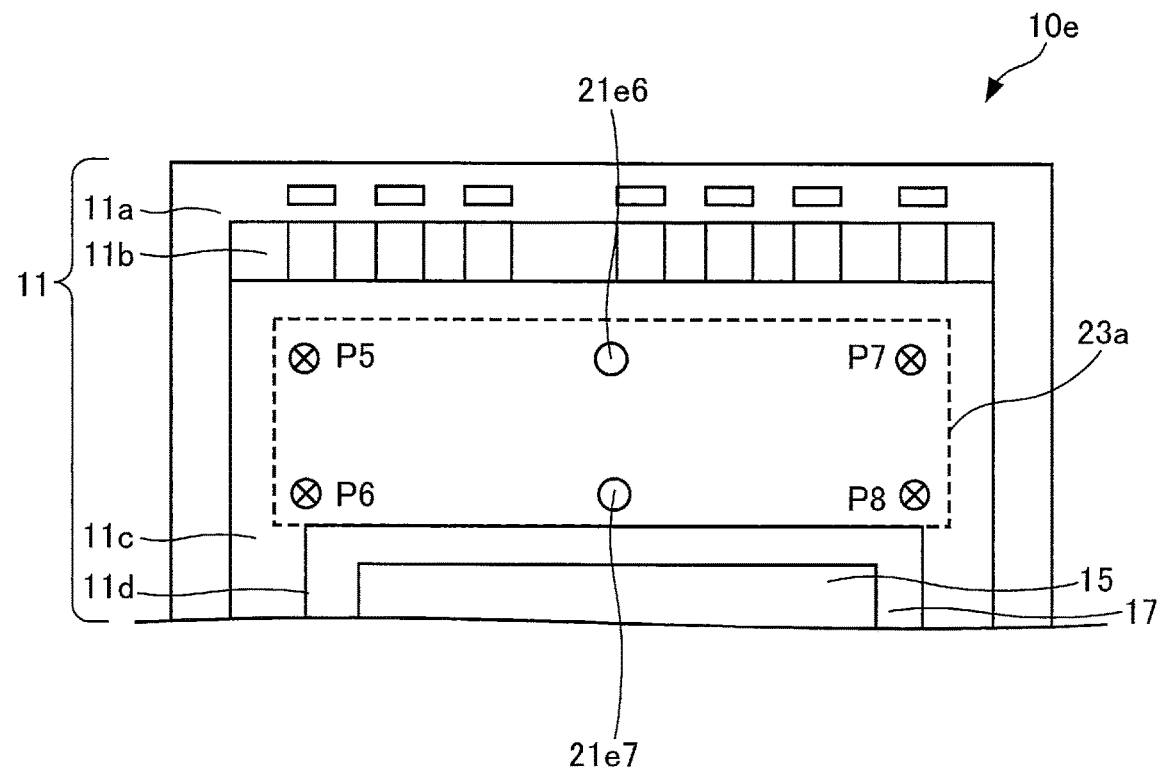

FIGS. 8A and 8B illustrate the arrangement positions of projections in the semiconductor device according to the second embodiment. Note that in FIGS. 8A and 8B, the installation area for the printed circuit board 23 is indicated by the broken line.

In a semiconductor device 10d illustrated in FIG. 8A, at least one projection 21e is formed on the line that passes through the center of the long side of the printed circuit board 23 in an installation area 23a and that is orthogonal to the long side.

Specifically, in the semiconductor device 10d illustrated in FIG. 8A, only a projection 21e5 is formed at the center of the bottom part 11c of the case 11.

The pressing positions P5 to P8 of the downwardly warped printed circuit board 23 are pressed against the installation area 23a on the bottom part 11c of the case 11 by the pressing jig 50 attached to the pressing apparatus, in the manner described above. The pressing positions P5 to P8 of the printed circuit board 23 that are located on the outer side of the projection 21e5 on the bottom part 11c are pressed while the center of the back surface of the printed circuit board 23 is supported by the projection 21e5. Therefore, the warpage is reduced. Thus, the printed circuit board 23 is fixed to the bottom part 11c by the adhesive 18 in a manner such that the center of the back surface of the printed circuit board 23 is supported by the projection 21e5.

In a semiconductor device 10e illustrated in FIG. 8B, two projections 21e6 and 21e7 are formed in the installation area 23a for the printed circuit board 23 on the bottom part 11c of the case 11. More specifically, the projections 21e6 and 21e7 are formed on the line that passes through the center of the long side of the installation area 23a and that is orthogonal to the long side.

As in the case of FIG. 8A, the downwardly warped printed circuit board 23 is pressed against the installation area 23a on the bottom part 11c of the case 11 by the pressing jig 50 attached to the pressing apparatus. The pressing positions P5 to P8 of the printed circuit board 23 that are located on the outer side of the projections 21e6 and 21e7 on the bottom part 11c are pressed while the center of the back surface of the printed circuit board 23 is supported by the projections 21e6 and 21e7. Therefore, the warpage is reduced. Thus, the printed circuit board 23 is fixed to the bottom part 11c by the adhesive 18 in a manner such that the center of the back surface of the printed circuit board 23 is supported by the projections 21e6 and 21e7.

Accordingly, in the case of the semiconductor devices 10d and 10e of FIGS. 8A and 8B, as in the case of the semiconductor device 10c, the adhesive 18 spreads over the entire back surface of the printed circuit board 23. Further, the adhesive 18 is prevented from spreading excessively beyond the back surface of the printed circuit board 23. At each of the opposite edges of the printed circuit board 23 in each of the long-side direction and the short-side direction, the end of the adhesive 18 is located between the back surface and the front surface on the side surface of the edge of the printed circuit board 23. Therefore, the adhesive 18 extending beyond the edges of the printed circuit board 23 does not extend over the front surface of the printed circuit board 23, the internal connection terminals 12a2 to 12g2, or the front surface of the ceramic circuit board 15.

Accordingly, in the semiconductor devices 10d and 10e, there is no unbonded area between the printed circuit board 23 and the bottom part 11c, and the gap between the printed circuit board 23 and the bottom part 11c maintains a height that ensures the adhesive force of the adhesive 18 therebetween. Therefore, the printed circuit board 23 is prevented from being separated from the bottom part 11c. Further, the front surface of the printed circuit board 23, the front surface of the ceramic circuit board 15, and the internal connection terminals 12a2 to 12g2 are prevented from being damaged by the adhesive 18. These prevent a reduction in reliability of the semiconductor devices 10d and 10e.

(c) Third Embodiment

In a third embodiment, a description will be given of the case where a printed circuit board that is warped downward or warped upward is disposed in the installation area on the bottom part 11c of the case 11, with reference to FIG. 9.

Figure 9:
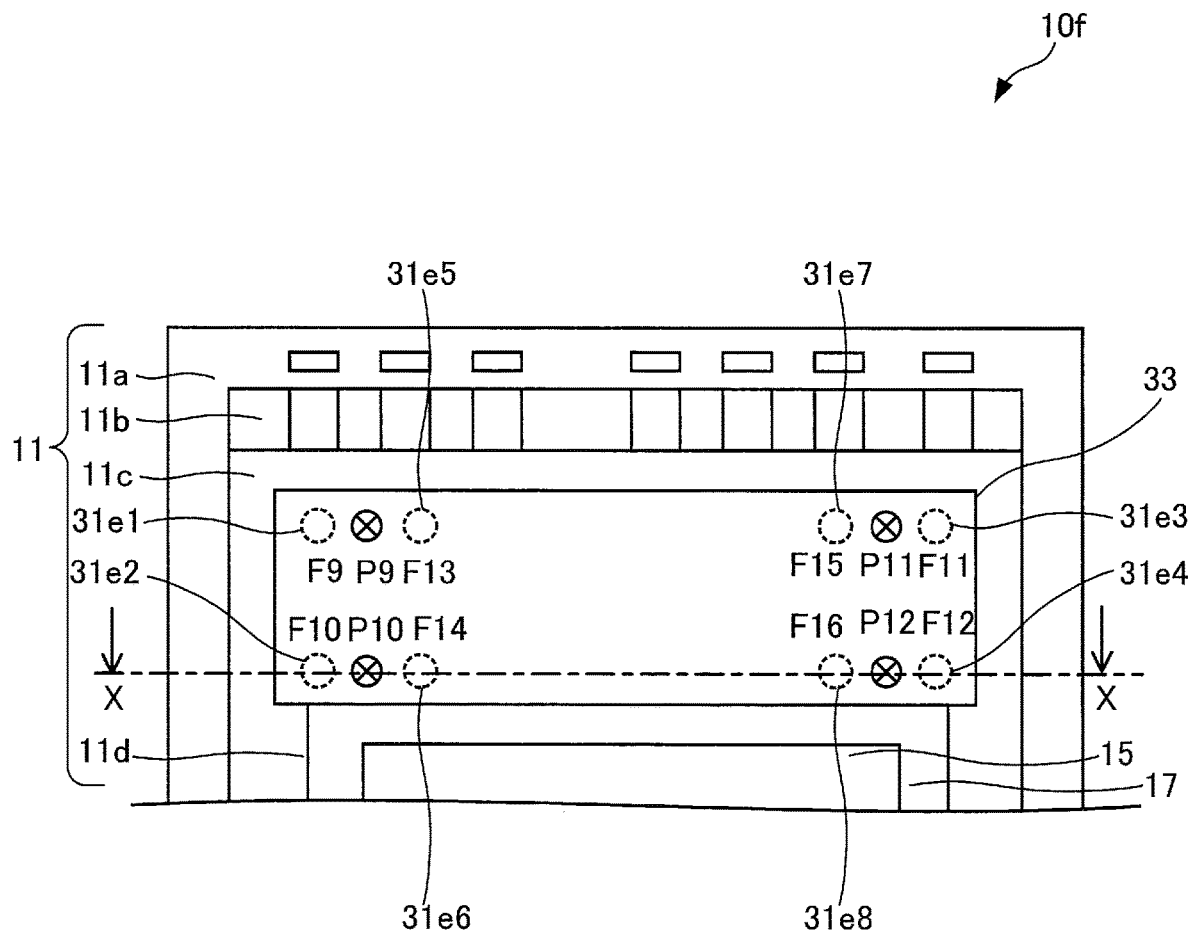
FIG. 9 illustrates the arrangement positions of projections in the semiconductor device according to a third embodiment.

FIG. 9 illustrates the arrangement positions of projections in the semiconductor device according to the third embodiment. Note that in FIG. 9, the formation positions F9 to F16 of the projections 31e1 to 31e8 are indicated by the broken lines.

Similar to the semiconductor device 10c illustrated in FIGS. 6, 7A, and 7B, a semiconductor device 10f includes a case 11, and a printed circuit board 33 and a ceramic circuit board 15 accommodated in the case 11. In FIG. 9, P9 to P12 on the printed circuit board 33 indicate the pressing positions where the printed circuit board 33 is pressed when mounting the printed circuit board 33 on the bottom part 11c. Further, the projections 31e1 to 31e4 are formed at the respective corners of the installation area for the printed circuit board 33 on the bottom part 11c. Also, the projections 31e5 to 31e8 are formed to be spaced apart by a predetermined distance from the respective projections 31e1 to 31e4 toward the inner side in the long-side direction of the printed circuit board 33.

Next, a description will be given of installation of the printed circuit board 33 in the installation area on the bottom part 11c of the case 11 in the semiconductor device 10f having the configuration described above, with reference to FIGS. 10A and 10B.

Figure 10A:
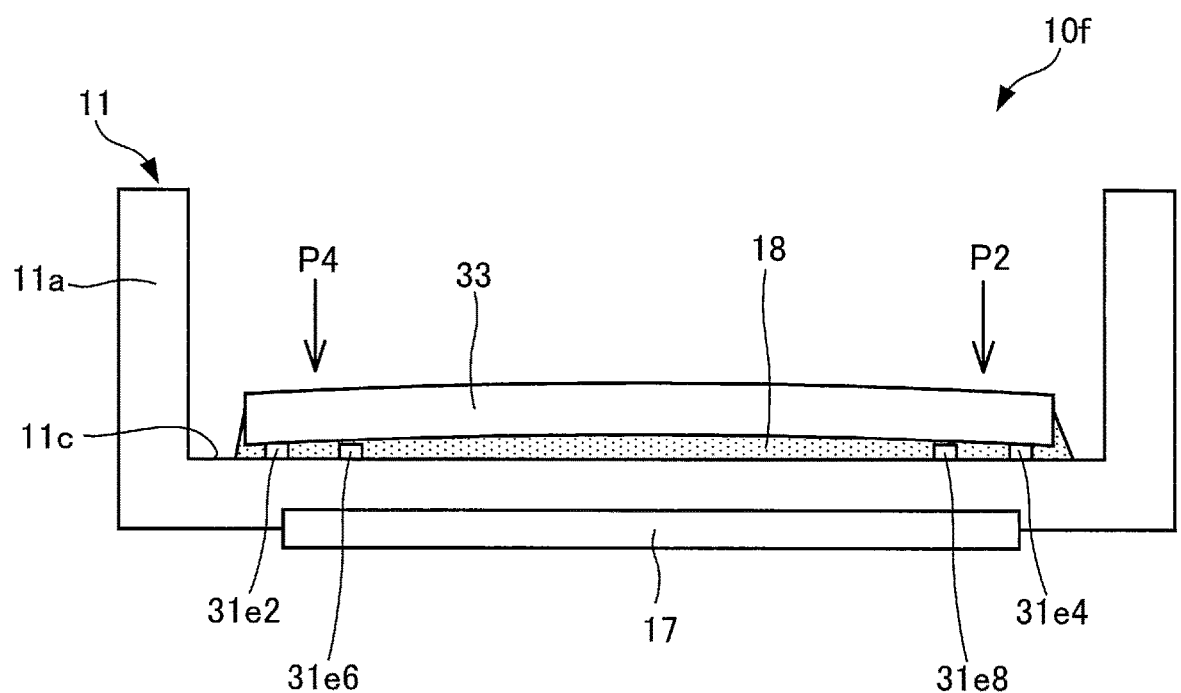
FIGS. 10A and 10B are cross-sectional views illustrating the semiconductor device according to the third embodiment.
Figure 10B:
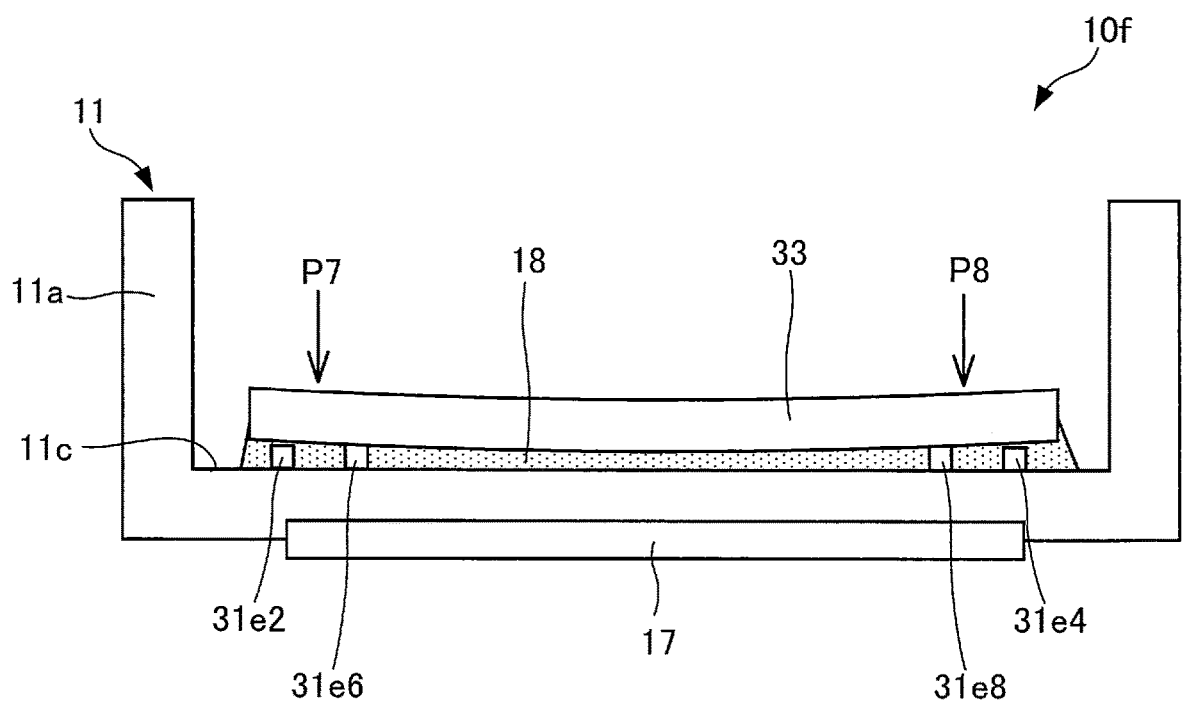
Figure 11:
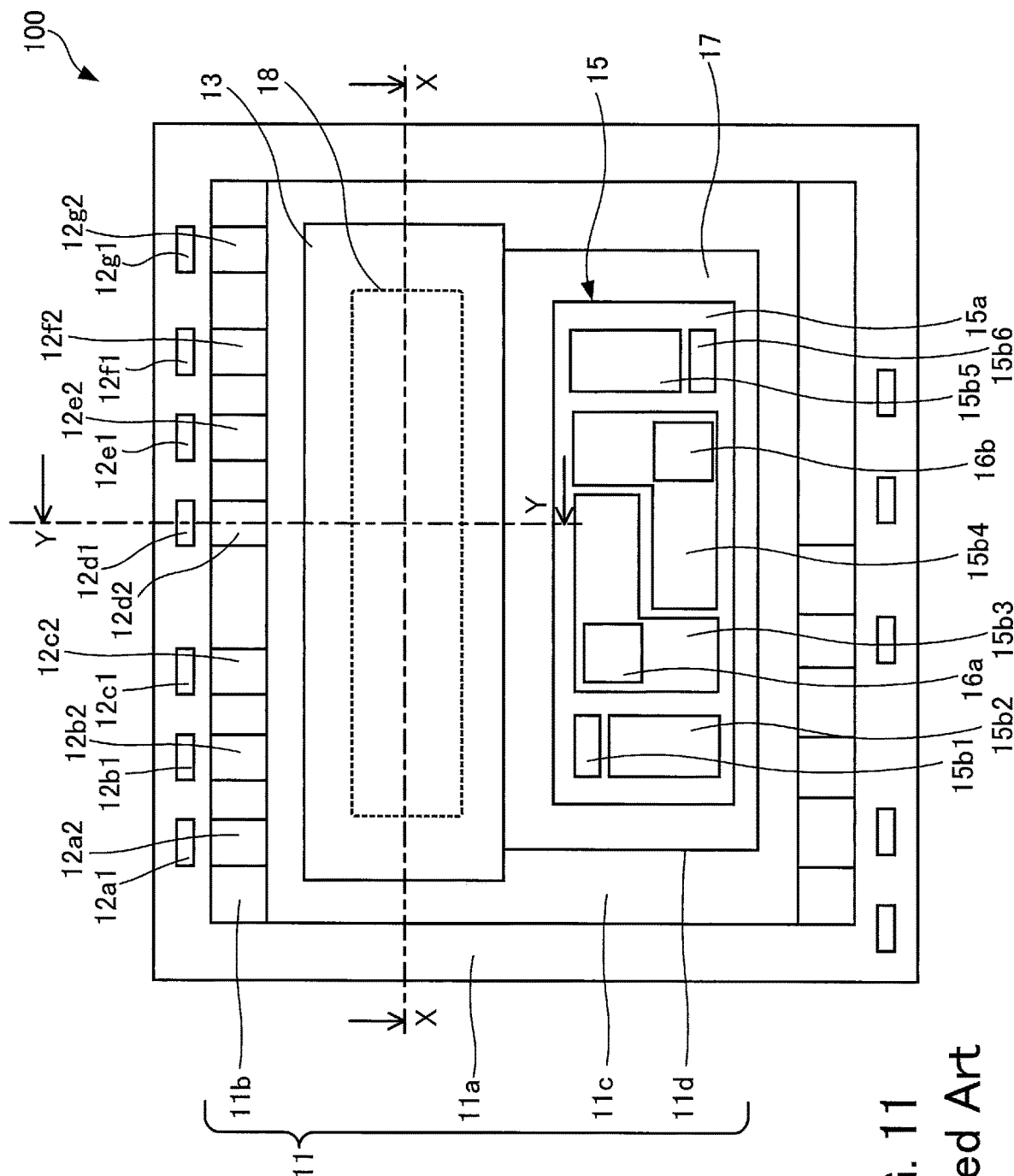
FIG. 11 is a plan view illustrating a conventional semiconductor device.

FIGS. 10A and 10B are cross-sectional views illustrating the semiconductor device according to the third embodiment. Note that FIG. 10A is a cross-sectional view of the upwardly warped printed circuit board 33 taken along the one-dot chain line X-X of FIG. 9, and FIG. 10B is a cross-sectional view of the downwardly warped printed circuit board 33 taken along the one-dot chain line X-X of FIG. 9.

First, a description will be given of the case where the printed circuit board 33 that is placed in the installation area on the bottom part 11c of the case 11 is warped upward.

As in the case of the first and second embodiments, the adhesive 18 is applied to the back surface of the upwardly warped printed circuit board 33, which faces the bottom part 11c of the case 11, as illustrated in FIGS. 12A and 12B, for example. Alternatively, the adhesive 18 may be applied to the installation area for the printed circuit board 33 on the bottom part 11c of the case 11.

Then, the printed circuit board 33 is installed in the installation area on the bottom part 11c. In this step, the corners of the back surface of the printed circuit board 33 are respectively supported by the projections 31e1 to 31e4 of the projections 31e1 to 31e8 formed on the bottom part 11c.

As in the case of the first and second embodiments, the case 11 with the printed circuit board 33 installed on the bottom part 11c is placed in a predetermined area of the pressing apparatus with the pressing jig 50 of FIG. 3 attached thereto. Note that the pressing pins 52a to 52d of the pressing jig 50 are positioned to correspond to the pressing positions P9 to P12 of the printed circuit board 33. Then, the pressing apparatus lowers the pressing part to bring the pressing portions 52a1 to 52d1 of the pressing pins 52a to 52d of the pressing jig 50 into contact with the respective pressing positions P9 to P12 of the printed circuit board 33. In this step, the pressing positions P9 to P12 of the upwardly warped printed circuit board 33 are located on the inner side of the projections 31e1 to 31e4, as illustrated in FIG. 9.

Then, the pressing apparatus presses the printed circuit board 33. The pressing apparatus keeps pressing until the adhesive 18 cures. The pressing positions P9 to P12 of the printed circuit board 33 that are located on the inner side of the projections 31e1 to 31e4 on the bottom part 11c are pressed while the back surface of the printed circuit board 33 is supported by the projections 31e1 to 31e4. Therefore, the warpage of the printed circuit board 33 is reduced. In this step, the pressing apparatus presses the printed circuit board 33 such that the printed circuit board 33 remains slightly warped. Then, as the printed circuit board 33 is pressed, the adhesive 18 is pressed and spread on the bottom part 11c of the case 11. Since the back surface of the thus pressed printed circuit board 33 is supported by the projections 31e1 to 31e4 on the bottom part 11c, a gap having a height substantially corresponding to the height of the projections 31e1 to 31e4 is maintained between the printed circuit board 33 and the bottom part 11c.

Therefore, as illustrated in FIG. 10A, at each of the opposite edges of the printed circuit board 33 in the long-side direction, the end of the adhesive 18 is located between the back surface and the front surface on the side surface of the edge of the printed circuit board 33.

Also, as in the case of FIG. 2B, at each of the opposite edges of the printed circuit board 13 in the short-side direction, the end of the adhesive 18 is located between the back surface and the front surface on the side surface of the edge of the printed circuit board 33.

In this case, the adhesive 18 extends slightly beyond the edges of the printed circuit board 33, but does not extend over the front surface of the printed circuit board 33, the internal connection terminals 12a2 to 12g2, or the front surface of the ceramic circuit board 15.

Next, a description will be given of the case where the printed circuit board 33 that is placed in the installation area on the bottom part 11c of the case 11 is warped downward.

As in the case of the first and second embodiments, the adhesive 18 is applied to the back surface of the downwardly warped printed circuit board 33, which faces the bottom part 11c of the case 11, as illustrated in FIGS. 12A and 12B, for example. Alternatively, the adhesive 18 may be applied to the installation area for the printed circuit board 33 on the bottom part 11c of the case 11.

Then, the printed circuit board 33 is installed in the installation area on the bottom part 11c. In this step, four points on the inner side of the corners of the back surface of the printed circuit board 33 in FIG. 9 are respectively supported by the projections 31e5 to 31e8 of the projections 31e1 to 31e8 formed on the bottom part 11c.

As in the case of the first and second embodiments, the case 11 with the printed circuit board 33 installed on the bottom part 11c is placed in a predetermined area of the pressing apparatus with the pressing jig 50 of FIG. 3 attached thereto. Note that the pressing pins 52a to 52d of the pressing jig 50 are positioned to correspond to the pressing positions P9 to P12 of the printed circuit board 33. Then, the pressing apparatus lowers the pressing part to bring the pressing portions 52a1 to 52d1 of the pressing pins 52a to 52d of the pressing jig 50 into contact with the respective pressing positions P9 to P12 of the printed circuit board 33. In this step, the pressing positions P9 to P12 of the downwardly warped printed circuit board 33 are located on the outer side of the projections 31e5 to 31e8, as illustrated in FIG. 9.

Then, the pressing apparatus presses the printed circuit board 33. The pressing apparatus keeps pressing until the adhesive 18 cures. The pressing positions P9 to P12 of the printed circuit board 33 that are located on the outer side of the projections 31e5 to 31e8 on the bottom part 11c are pressed while the back surface of the printed circuit board 33 is supported by the projections 31e5 to 31e8. Therefore, the warpage of the printed circuit board 33 is reduced. Then, as the printed circuit board 33 is pressed, the adhesive 18 is pressed and spread on the bottom part 11c of the case 11. Since the back surface of the thus pressed printed circuit board 33 is supported by the projections 31e5 to 31e8 on the bottom part 11c, a gap having a height substantially corresponding to the height of the projections 31e5 to 31e8 is maintained between the printed circuit board 33 and the bottom part 11c.

Therefore, as illustrated in FIG. 10B, at each of the opposite edges of the printed circuit board 33 in the long-side direction, the end of the adhesive 18 is located between the back surface and the front surface on the side surface of the edge of the printed circuit board 33.

Also, as in the case of FIG. 7B, at each opposite edge of the printed circuit board 33 in the short-side direction, the end of the adhesive 18 is located between the back surface and the front surface on the side surface.

In this case as well, the adhesive 18 extends slightly beyond the edges of the printed circuit board 33, but does not extend over the front surface of the printed circuit board 33, the internal connection terminals 12a2 to 12g2, or the front surface of the ceramic circuit board 15.

The semiconductor device 10f described above includes the printed circuit board 33 having a rectangular shape in plan view, and the case 11 in which the projections 31e1 to 31e8 are formed at the formation positions F9 to F16 in the installation area where the printed circuit board 33 is disposed with the adhesive 18 interposed therebetween. The projections 31e1 to 31e8 support the printed circuit board 33 from the back surface side thereof to maintain a gap of a predetermined distance between the installation area and the back surface.

Accordingly, if the printed circuit board 33 is warped upward, when the printed circuit board 33 with the adhesive 18 applied to the back surface thereof is pressed against the bottom part 11c of the case 11, the printed circuit board 33 is supported from the back surface side thereof by the outer projections 31e1 to 31e4 of the projections 31e1 to 31e8 formed on the bottom part 11c. Meanwhile, if the printed circuit board 33 is warped downward, when the printed circuit board 33 with the adhesive 18 applied to the back surface thereof is pressed against the bottom part 11c of the case 11, the printed circuit board 33 is supported from the back surface side thereof by the inner projections 31e5 to 31e8 of the projections 31e1 to 31e8 formed on the bottom part 11c.

Therefore, the gap between the printed circuit board 33 and the bottom part 11c is maintained, so that the adhesive 18 pressed by the printed circuit board 33 spreads over the entire back surface of the printed circuit board 33. Further, the adhesive 18 is prevented from spreading excessively beyond the back surface of the printed circuit board 33. Consequently, at each of the opposite edges of the printed circuit board 33 in each of the long-side direction and the short-side direction, the end of the adhesive 18 is located between the back surface and the front surface on the side surface of the edge of the printed circuit board 33. Therefore, the adhesive 18 extending beyond the edges of the printed circuit board 33 in the short-side direction does not extend over the front surface of the printed circuit board 33, the internal connection terminals 12a2 to 12g2, or the front surface of the ceramic circuit board 15.

Accordingly, in the semiconductor device 10f, there is no unbonded area between the printed circuit board 33 and the bottom part 11c, and the gap between the printed circuit board 33 and the bottom part 11c maintains a height that ensures the adhesive force of the adhesive 18 therebetween. Therefore, the printed circuit board 33 is prevented from being separated from the bottom part 11c. Further, the front surface of the printed circuit board 33, the front surface of the ceramic circuit board 15, and the internal connection terminals 12a2 to 12g2 are prevented from being damaged by the adhesive 18. These prevent a reduction in reliability of the semiconductor device 10f.

Note that in the first embodiment, the configuration of FIG. 5B is applied in the case where the printed circuit board 13 is warped upward. Also, as in the case of FIG. 10B, the configuration of FIG. 5B may be applied in the case where the printed circuit board 13 is warped downward.

According to the disclosed technique, it is possible to prevent separation of a printed circuit board, prevent damage to electronic components and the like, and thereby prevent a reduction in reliability of a semiconductor device.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
a printed circuit board having a rectangular shape in a plan view, and having front and rear surfaces; and
a case having an installation area in which the printed circuit board is disposed, the printed circuit board being attached to the case using an adhesive bonding member that is interposed between the rear surface of the printed circuit board and the installation area of the case, the case having at least one projection that is disposed in the installation area, and that supports the printed circuit board to maintain a gap between the installation area of the case and the printed circuit board, the printed circuit board being warped with respect to a surface of the installation area, wherein
the adhesive bonding member is interposed between an entire area of the rear surface of the printed circuit board and an entire area of the installation area of the case, and
a distance between a surface of the installation area and the front surface of the printed circuit board at a center of the printed circuit board is different from a distance between the surface of the installation area and the front surface of the printed circuit board at an outer periphery of the printed circuit board.

2. The semiconductor device according to claim 1, wherein the installation area of the case has four corners each facing a respective corner of the printed circuit board, the at least one projection being disposed in a vicinity of one of the four corners of the installation area.

3. The semiconductor device according to claim 2, wherein the at least one projection comprises a plurality of projections each being disposed in a vicinity of a respective one of the four corners of the installation area.

4. The semiconductor device according to claim 2, wherein the at least one projection further includes a projection that is disposed at a center of the installation area to face a center of the printed circuit board.

5. The semiconductor device according to claim 2, wherein
the printed circuit board has longer sides and shorter sides in the plan view, and
the at least one projection comprises
a first projection that is disposed in the vicinity of the one of the four corners of the installation area, and
a second projection that is disposed between the vicinity of the one of the four corners and a vicinity of another one of the four corners of the installation area.

6. The semiconductor device according to claim 5, wherein the first projection and the second projection are arranged in a direction parallel to the longer sides.

7. The semiconductor device according to claim 5, wherein
the first projection is provided in plurality,
the second projection is provided in plurality,
one of the plurality of first projections is disposed in the vicinity of each of the four corners of the installation area.

8. The semiconductor device according to claim 1, wherein
the printed circuit board has longer sides and shorter sides in the plan view, and
the at least one projection includes a projection that is disposed on a center line that extends in a direction orthogonal to the longer side, the center line passing through a center of the longer side.

9. The semiconductor device according to claim 1, wherein the printed circuit board is warped upward.

10. The semiconductor device according to claim 1, wherein the printed circuit board is warped downward.

11. The semiconductor device according to claim 1, wherein the at least one projection has one of a rectangular shape and a trapezoidal shape in a cross section taken perpendicular to the installation area.

12. The semiconductor device according to claim 9, wherein the at least one projection has one of a circular shape, an elliptical shape, and a rectangular shape in a cross section taken parallel to the installation area.

13. The semiconductor device according to claim 10, wherein the at least one projection has a height that is in a range of 0.08 mm to 0.15 mm.

14. The semiconductor device according to claim 11, wherein the at least one projection has a width that is in a range of 0.5 mm to 1.5 mm.

15. A method of manufacturing a semiconductor device, comprising:
providing a printed circuit board having a rectangular shape in a plan view, and having front and rear surfaces, the printed circuit board being warped upward;
providing a case having an installation area in which the printed circuit board is to be disposed, the case having four projections, each of which is disposed in a vicinity of a respective one of four corners of the installation area;
placing the rear surface of the printed circuit board on the installation area of the case, with an adhesive bonding member being interposed between an entire area of the rear surface of the printed circuit board and an entire area of the installation area of the case, a distance between a surface of the installation area and the front surface of the printed circuit board at a center of the printed circuit board being different from a distance between the surface of the installation area and the front surface of the printed circuit board at an outer periphery of the printed circuit board; and simultaneously pressing the front surface of the printed circuit board at four pressing positions until the bonding member cures, the four pressing positions being located within an inside of an area in which the four projections are disposed.

16. A method of manufacturing a semiconductor device, comprising:

providing a printed circuit board having a rectangular shape in a plan view, the printed circuit board having front and rear surfaces, and being warped downward;

providing a case including an installation area in which a print circuit board is to be installed and at least one projection formed at at least one predetermined position within the installation area being located within a region inside from a respective corner of the printed circuit board;

placing the rear surface of the printed circuit board on the installation area of the case, with an adhesive bonding member being interposed between an entire area of the rear surface of the printed circuit board and an entire area of the installation area of the case, a distance between a surface of the installation area and the front surface of the printed circuit board at a center of the printed circuit board being different from a distance between the surface of the installation area and the front surface of the printed circuit board at an outer periphery of the printed circuit board; and simultaneously pressing the front surface at the respective corners thereof until the bonding member cures.

17. The method of manufacturing a semiconductor device according to claim 16, wherein the printed circuit board has longer sides and shorter sides in the plan view, and the at least one predetermined position includes at least one first position that is located in a vicinity of one of the four corners of the installation area, and at least one second position that is located between the first position and a vicinity of another one of the four corners of the installation area.

18. The method of manufacturing a semiconductor device according to claim 15, wherein the printed circuit board has longer sides and shorter sides in the plan view, and the one or more predetermined positions include at least one position that is located on a center line that extends in a direction orthogonal to the longer side, the center line passing through a center of the longer side.

* * * * *